United States Patent
Baek et al.

(10) Patent No.: US 10,109,664 B2
(45) Date of Patent: Oct. 23, 2018

(54) IMAGE SENSORS AND METHODS OF FABRICATING THE SAME

(71) Applicant: Samsung Electronics Co., Ltd., Suwon-si, Gyeonggi-do (KR)

(72) Inventors: In Gyu Baek, Seoul (KR); Sang Hoon Uhm, Suwon-si (KR); Tae Yon Lee, Seoul (KR); Jae Sung Hur, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/607,958

(22) Filed: May 30, 2017

(65) Prior Publication Data

US 2018/0053796 A1      Feb. 22, 2018

(30) Foreign Application Priority Data

Aug. 16, 2016    (KR) .................. 10-2016-0103426

(51) Int. Cl.
*H01L 31/0232*   (2014.01)
*H01L 27/146*   (2006.01)

(52) U.S. Cl.
CPC .... *H01L 27/1463* (2013.01); *H01L 27/14627* (2013.01)

(58) Field of Classification Search
USPC ....... 257/432, 219, 225, 239, 240, 241, 246, 257/E27.082–E27.083, E27.15–E27.163, 257/E29.065, E29.227–E29.24; 438/22, 438/24, 48, 60, 75, 144
See application file for complete search history.

(56) References Cited

U.S. PATENT DOCUMENTS

| | | | |
|---|---|---|---|
| 8,410,418 B2 | 4/2013 | Yamaguchi et al. | |
| 8,669,634 B2 | 3/2014 | Kanbe et al. | |
| 8,917,342 B2 | 12/2014 | Ohta | |
| 9,040,343 B2 | 5/2015 | Enomoto et al. | |
| 2014/0054662 A1 | 2/2014 | Yanagita et al. | |
| 2014/0110806 A1 | 4/2014 | Watanabe et al. | |
| 2014/0218578 A1 | 8/2014 | Kohyama | |
| 2015/0036031 A1 | 2/2015 | Kamimura | |
| 2015/0091121 A1* | 4/2015 | Manda .............. H01L 27/14621 257/443 |
| 2015/0325606 A1 | 11/2015 | Togashi et al. | |
| 2015/0372031 A1 | 12/2015 | Yoon et al. | |

* cited by examiner

*Primary Examiner* — Tram H Nguyen
(74) *Attorney, Agent, or Firm* — Harness, Dickey & Pierce, P.L.C.

(57) ABSTRACT

An image sensor configured to provide improved reliability may include a charge passivation layer that includes a multiple different elements, each element of the different elements being a metal element or a metalloid element. The different elements may include a first element of a first group of periodic table elements and a second element of a second, different group of periodic table elements. The charge passivation layer may include an amorphous crystal structure.

19 Claims, 20 Drawing Sheets

IMAGE SENSORS AND METHODS OF FABRICATING THE SAME

CROSS-REFERENCE TO RELATED APPLICATIONS

This application claims priority under 35 U.S.C. § 119 from Korean Patent Application No. 10-2016-0103426 filed on Aug. 16, 2016 in the Korean Intellectual Property Office, the contents of which in its entirety are herein incorporated by reference.

BACKGROUND

1. Technical Field

The present disclosure relates to image sensors and methods of fabricating the same.

2. Description of the Related Art

An image sensor is a device configured to convert an optical image into an electrical signal. Image sensors may be categorized into charge coupled device (CCD) types and complementary metal oxide semiconductor (CMOS) types. The CMOS type image sensors may be referred to as 'CIS' (CMOS image sensors). A CIS may include a plurality of 2-dimensionally arranged pixels (e.g., an array of pixels). Each of the pixels may include a photodiode (PD). The photodiode may be configured to convert incident light into an electrical signal.

In recent years, development in the computer and the communication industries has enabled increased demand for image sensors configured to provide enhanced performance in a variety of fields such as digital cameras, camcorders, personal communication systems (PCS), gaming devices, security cameras, medical micro cameras, robots, and so on. Further, highly-integrated semiconductor devices have enabled high integration of image sensors.

SUMMARY

Some example embodiments provide an image sensor capable of improving a dark state characteristic to thus improve reliability.

Some example embodiments provide a method of fabricating an image sensor capable of improving a dark state characteristic to thus improve reliability.

The objects according to the present disclosure are not limited to those set forth above and objects other than those set forth above will be clearly understood to a person skilled in the art from the following description.

According to some example embodiments, an image sensor may include: a substrate including a first surface and a second surface opposite to each other, the substrate further including a photoelectric conversion device; an insulating structure on the first surface of the substrate, the insulating structure including a metal wiring; a charge passivation layer on the second surface of the substrate, the charge passivation layer including an amorphous crystal structure, the charge passivation layer further including a plurality of different elements, each element of the different elements being a metal element or a metalloid element; and a microlens on the charge passivation layer.

According to some example embodiments, an image sensor may include: a substrate including a first surface and a second surface opposite to each other, the substrate further including a photoelectric conversion device; an insulating structure on the first surface of the substrate, the insulating structure including a metal wiring; a charge passivation layer including on the second surface of the substrate, the charge passivation layer including a first layer portion on the second surface of the substrate and a second layer portion on the first layer portion, at least a portion of the charge passivation layer including an amorphous crystal structure, the first layer portion and the second layer portion including a common material, and a stoichiometry of the first layer portion being different from a stoichiometry of the second layer portion; and a microlens on the charge passivation layer.

According to some example embodiments, an image sensor may include: a substrate including a sensing region, an optical black (OB) region, a peripheral region defined therein, the substrate further including a photoelectric conversion device; an insulating structure on a first surface of the substrate, the insulating structure including a metal wiring; a charge passivation layer on a second surface of the substrate opposite the first surface, the charge passivation layer extending across the sensing region and the OB region of the substrate, the charge passivation layer including a plurality of different elements, each element of the different elements being a metal element or a metalloid element, at least a portion of the charge passivation layer including an amorphous crystal structure; and a plurality of microlenses on the charge passivation layer.

According to some example embodiments, a method of fabricating an image sensor may include: forming a photoelectric conversion device within a substrate, the substrate including a first surface and a second surface opposite to each other; forming an insulating structure on the first surface of the substrate, the insulating structure including a metal wiring; forming a first charge passivation layer on the second surface of the substrate, the first charge passivation layer including an amorphous crystal structure, the first charge passivation layer further including a plurality of different elements, each element of the different elements being a metal element or a metalloid element; forming a color filter on the first charge passivation layer; and forming a microlens on the color filter.

According to some example embodiments, an image sensor may include: a substrate; and a charge passivation layer on the substrate. The charge passivation layer may include an oxide material that includes a plurality of different elements, each element of the different elements being a metal element or a metalloid element.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
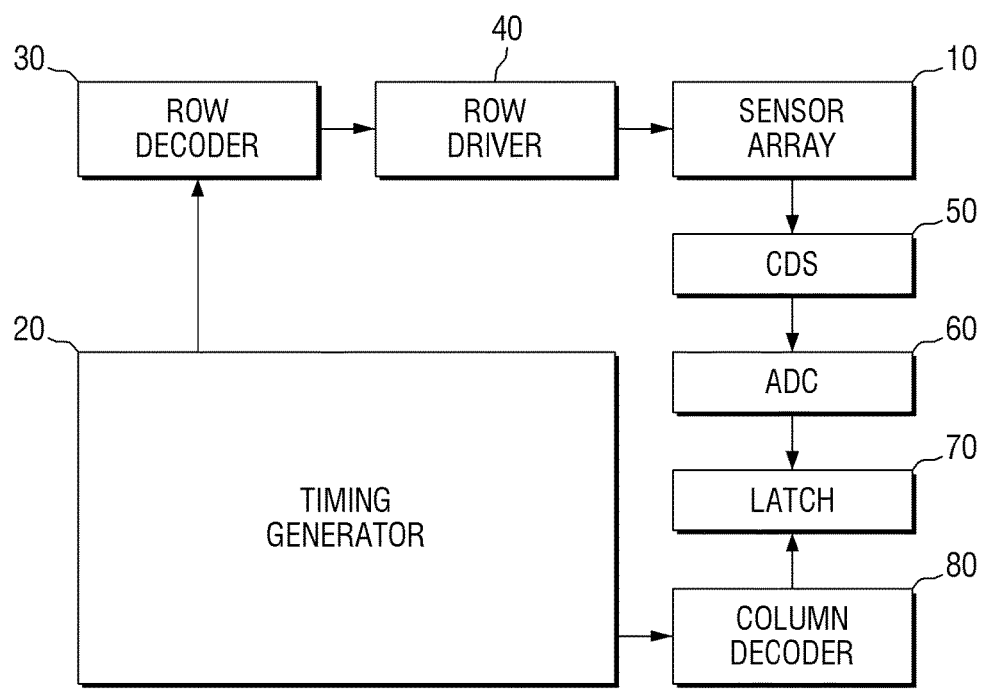
FIG. 1 is a block diagram of an image sensor according to some example embodiments.

FIG. 1 is a block diagram of an image sensor according to some example embodiments.

Referring to FIG. 1, an image sensor according to some example embodiments includes a sensor array 10 composed of (e.g., at least partially comprising) 2-dimensionally arranged pixels each including photoelectric conversion devices, a timing generator 20, a row decoder 30, a row driver 40, a correlated double sampler (CDS) 50, an analog to digital converter (ADC) 60, a latch 70, a column decoder 80, and so on.

The sensor array 10 includes a plurality of 2-dimensionally arranged unit pixels. A plurality of unit pixels may be configured to convert an optical image into an electrical output signal. The sensor array 10 receives a plurality of driving signals including row-select signal, reset signal, charge transmission signal, and so on such that the sensor array 10 is driven accordingly. Further, the converted electrical output signal may be provided to the correlated double sampler 50 through vertical signal lines.

The timing generator 20 provides a timing signal and a control signal to the row decoder 30 and the column decoder 80.

The row driver 40 provides the active pixel sensor array 10 with a plurality of driving signals to drive a plurality of unit pixels according to a result of decoding at the row decoder 30. Generally, the driving signals are provided to each of the rows when the unit pixels are arranged in a matrix form.

The correlated double sampler 50 receives an output signal formed at the active pixel sensor array 10 through a vertical signal line, and holds and samples the same. That is, the correlated double sampler 50 double-samples a certain noise level, and a signal level according to the output signal, and outputs a difference level corresponding to a difference between the noise level and the signal level.

The analog to digital converter 60 converts an analog signal corresponding to the difference level into a digital signal, and outputs the result.

The latch 70 latches the digital signal, and the latched signal is outputted to an image signal processor in sequence according to the result of decoding at the column decoder 80.

Figure 2:
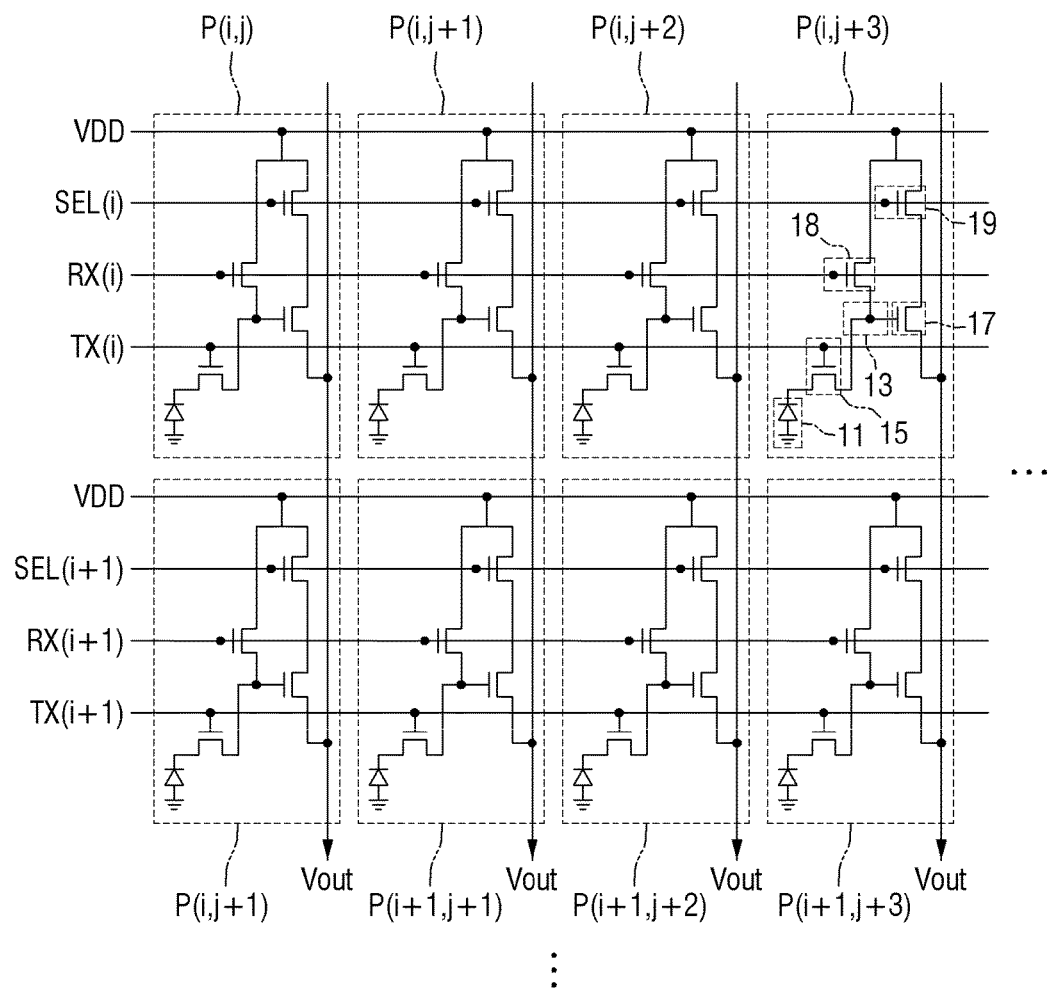
FIG. 2 is an equivalent circuit diagram of the sensor array of FIG. 1.

FIG. 2 is an equivalent circuit diagram of the sensor array of FIG. 1.

Referring to FIG. 2, pixels P are arranged into a matrix pattern to form the sensor array 10. Each of the pixels P includes a photoelectric conversion device 11, a floating diffusion region 13, a charge transfer device 15, a drive device 17, a reset device 18, and a select device 19. The functions of those mentioned above will be described with reference to i-th row pixel (P(i, j), P(i, j+1), P(i, j+2), P(i, j+3), . . . ) as an example.

The photoelectric conversion device 11 absorbs incident light and accumulates charges corresponding to a quantity of light. For the photoelectric conversion device 11, photodiode, phototransistor, photogate, pinned photodiode or a combination thereof may be applied, although the photodiode is illustrated in the drawings as an example.

Each of the photoelectric conversion devices 11 is coupled with each of the charge transfer devices 15 that transfer the accumulated charges to the floating diffusion region 13. The floating diffusion region (FD) 13 is where the charges are converted into voltages, and because of the parasitic capacitance, the charges are accumulatively stored.

The drive device 17, exemplified herein as a source follower amplifier, amplifies a change in the electrical potential in the floating diffusion region 13 transferred with the accumulated charges of each of the photoelectric conversion devices 11, and outputs the amplified result to the output line Vout.

The reset device 18 periodically resets the floating diffusion region 13. The reset device 18 may be composed of one MOS transistor that is driven by the bias provided by a reset line RX(i) for applying a predetermined bias (i.e., reset signal). When the reset device 18 is turned on by the bias provided by the reset line RX(i), a predetermined electrical potential provided to a drain of the reset device 18, e.g., a power voltage VDD, is transmitted to the floating diffusion region 13.

The select device 19 plays a role of selecting a pixel P to read in a row unit. The select device 19 may be composed of one MOS transistor that is driven by the bias (i.e., row select signal) provided by the row select line SEL(i). When the select device 19 is turned on by the bias provided by the row select line SEL(i), a predetermined electrical potential provided to a drain of the select device 19, e.g., a power voltage VDD, is transmitted to the drain region of the drive device 17.

The transfer line TX(i) to apply bias to the charge transfer device 15, the reset line RX(i) to apply bias to the reset device 18, and the row select line SEL(i) to apply bias to the select device 19 may extend substantially in parallel with each other and arranged.

Figure 3:
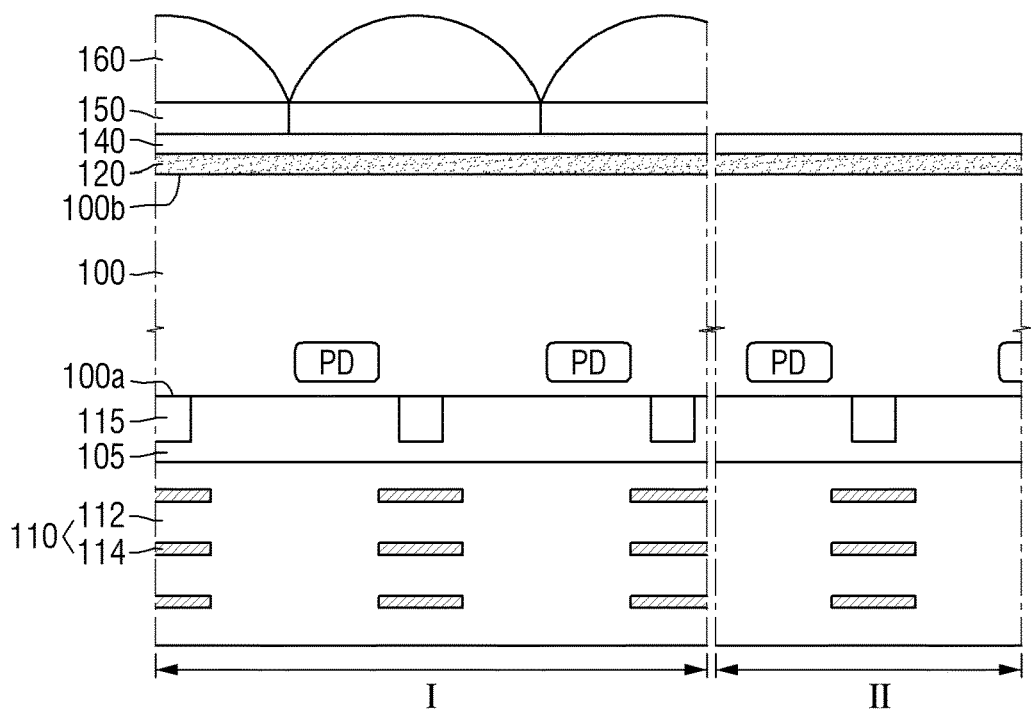
FIG. 3 is a view provided to explain an image sensor according to some example embodiments.

FIG. 3 is a view provided to explain an image sensor according to some example embodiments.

Referring to FIG. 3, an image sensor according to some example embodiments may include a first region I and a second region II. The image sensor includes an insulating structure 110 and a first charge passivation layer 120 formed in the first region I and the second region II. Further, the image sensor may include a color filter layer 150 and a plurality of microlenses 160 formed in the first region I.

The first region I may be a sensing region, and the second region II may be an optical black region, or, OB region. The first region I and the second region II may be the regions where the sensor array 10 of FIG. 1 is formed. The second region II is the region where entrance of the light is blocked to provide a reference of a black signal to the first region I. The second region II is formed in the same structure as the first region I, but is configured to shield incident light. Accordingly, the dark current of the sensor array in the first region I is corrected with reference to the dark current in the second region II.

The substrate 100 may include a first surface 100a and a second surface 100b opposite to each other. The first surface 100a of the substrate 100 may be a front side of the substrate 100, and the second surface 100b of the substrate 100 may be the back side of the substrate 100.

The substrate 100 may include a P-type or N-type bulk substrate, may include a P-type or N-type epitaxial layer grown on the P-type bulk substrate, or may include a P-type or N-type epitaxial layer grown on the N-type bulk substrate. Further, a substrate other than a semiconductor substrate, such as, an organic plastic substrate, and so on, may also be included in the substrate 100.

A photoelectric conversion device, e.g., a photodiode PD, is formed within the substrate 100 in the first region I and the second region II. The photoelectric conversion device PD may be formed near the first surface 100a of the substrate 100, although example embodiments are not limited to any specific example only.

A plurality of first gates 115 may be disposed on the first surface 100a of the substrate 100. For example, the first gates 115 may include gates of the charge transfer device, gates of the reset device, gates of the drive device, and so on. Although FIG. 3 illustrates that the first gates 115 are formed on the first surface 100a of the substrate 100, example embodiments are not limited to any specific example only. Accordingly, in some example embodiments, one or more of the first gates 115 may be formed as being recessed into or buried in the substrate 100, such that the one or more first gates 115 extend into the substrate 100 from the first surface 100a or the second surface 100b.

The insulating structure 110 may be disposed on the first surface 100a of the substrate 100. That is, the insulating structure 110 may be formed on the front side of the substrate 100. The insulating structure 110 may include an interlayer insulating film 112 and a first metal wiring 114.

The interlayer insulating film 112 may include at least one of silicon oxide, silicon nitride, silicon oxynitride, low-k dielectric material, and a combination of the above materials.

The first metal wiring 114 may include aluminum (Al), copper (Cu), tungsten (W), cobalt (Co), ruthenium (Ru), and so on, but not limited thereto.

The first metal wiring 114 may be formed in the first region I and the second region II, and may include a plurality of sequentially stacked wirings. Although FIG. 3 illustrates three sequentially-stacked layers of the first metal wirings 114, this is provided only for convenience of explanation, and the example embodiments are not limited to any specific example only.

A pre-metal dielectric film layer 105 may be disposed between the substrate 100 and the insulating structure 110.

The pre-metal dielectric film layer 105 may overlie (e.g., cover) the first gates 115 disposed on the substrate 100.

The pre-metal dielectric film layer 105 may include at least one of silicon oxide, silicon nitride, silicon oxynitride, low-k dielectric material, and a combination of the above materials.

The first charge passivation layer 120 may be disposed on the second surface 100b of the substrate 100. That is, the first charge passivation layer 120 may be formed on the back side of the substrate 100. The first charge passivation layer 120 may be disposed along (e.g., extend along, extend across, be disposed across, etc.) the second surface 100b of the substrate 100.

The first charge passivation layer 120 is disposed across the first region I and the second region II. Specifically, the first charge passivation layer 120 may be entirely formed in the first region I and the second region II. The first charge passivation layer 120 is formed across the first region I and the second region II, in order to equalize the noise references of the sensor array formed in the first region I and the second region II.

In the image sensor according to some example embodiments, the first charge passivation layer 120 may be formed in contact with the substrate 100, i.e., with the second surface 100b of the substrate 100.

In some example embodiments, the first charge passivation layer 120 includes a high-k insulating material. The first charge passivation layer 120 may include an amorphous crystal structure. In some example embodiments, at least a portion of a high-k insulating material included in the first charge passivation layer 120 may have an amorphous crystal structure.

For example, the first charge passivation layer 120 may entirely have an amorphous crystal structure. In another example, the first charge passivation layer 120 may have an amorphous crystal structure that includes crystal grains in the amorphous crystal structure matrix. In another example, the first charge passivation layer 120 may have a crystalline structure that includes an amorphous crystal structure in the crystalline structure matrix.

The first charge passivation layer 120 may include two or more different metal or metalloid elements. Restated, the first charge passivation layer 120 may include a plurality of different elements, each element of the different elements being a metal element or a metalloid element. The high-k insulating material included in the first charge passivation layer 120 may be an oxide that includes two or more different metal or metalloid elements. The first charge passivation layer 120 may include an oxide that includes at least one metal element. The first charge passivation layer 120 may include high-k insulating material that includes at least one metal element.

The first charge passivation layer 120 is assumed to include an oxide material having chemical formula $A_xB_yO_z$ where each of x, y and z may be a number that is greater than 0 and less than or equal to 5. In some example embodiments, the first charge passivation layer 120 may be an oxide material that includes a plurality of metallic elements, each metallic element of the plurality of metallic elements including a metal element or a metalloid element.

In some example embodiments, in the first charge passivation layer 120, A and B may be two different metal elements. That is, the first charge passivation layer 120 may be an oxide that includes two or more different metal elements.

In some example embodiments, in the first charge passivation layer 120, A may be a metal element, and B may be a metalloid element. That is, the first charge passivation layer 120 may be an oxide material that includes at least one metalloid element, and at least one metal element.

The first charge passivation layer 120 may include one or more metal or metalloid elements selected from the first group of the periodic table (e.g., group of periodic table elements), and the first charge passivation layer 120 may further include one or more metal or metalloid elements selected from a second group of the periodic table, where the second group is different from the first group.

The high-k insulating material included in the first charge passivation layer 120 may include a metal or metalloid element selected from the first group, and a metal or metalloid element selected from the second group of the periodic table, where the second group is different from the first group.

In the chemical formula $A_xB_yO_z$ mentioned above, element A may be a metal or metalloid element selected from the first group of the periodic table (e.g., group of periodic table elements), and element B may be a metal or metalloid element selected from the second group of the periodic table that is different from the first group. In some example embodiments, the periodic table includes 18 groups. For example, group IVB and group IVA represent different groups from each other.

In some example embodiments, the first charge passivation layer 120 may include an oxide that includes at least two of hafnium (Hf), zirconium (Zr), titanium (Ti), aluminum (Al), silicon (Si), tantalum (Ta), yttrium (Y), and lanthanide, although example embodiments are not limited thereto.

In some example embodiments, the thickness of the first charge passivation layer 120 may be greater than or equal to 100 Å, and less than or equal to 1000 Å.

In some example embodiments, the first charge passivation layer 120 may be associated with a refractive index (n) that is greater than or equal to 1.6, and less than or equal to 4, for example, such that the first charge passivation layer 120 is configured to reduce and/or prevent incident light entering the second surface 100b of the substrate 100 from reflecting against the first charge passivation layer 120.

In some example embodiments, the first charge passivation layer 120 may be associated with an extinction coefficient (k) that is less than or equal to 0.01, for example, such that the transmittance of the first charge passivation layer 120 is equal to or greater than 95%.

The color filter layer 150 may be disposed on the first charge passivation layer 120 in the first region I. The color filter layer 150 may be formed on the second surface 100b of the substrate 100, and disposed between the first charge passivation layer 120 and the microlens 160 to be described below.

That is, the first charge passivation layer 120 is formed between the color filter layer 150 and the second surface 100b of the substrate 100. The color filter layer 150 may include a red color filter, a green color filter, and a blue color filter.

The microlens 160 is formed on the first charge passivation layer 120 in the first region I. Specifically, the microlens 160 may be formed on the first charge passivation layer 120 and the color filter layer 150 that are stacked sequentially on the second surface 100b of the substrate 100. The microlens 160 may be composed of (e.g., at least partially comprise) an organic material such as photosensitive resin, or inorganic material.

A planarization film 140 may be disposed between the first charge passivation layer 120 and the color filter layer 150. The planarization film 140 may include at least one of silicon oxide film-based material, silicon nitride film-based material, resin or a combination thereof.

Although the planarization film 140 is illustrated as a single-layered film, this is provided only for convenience of explanation and the present disclosure is not limited thereto.

Although not illustrated in FIG. 3, there may be several additional films, including a light blocking film configured to block incident light from entering the second region II of the substrate 100 through the second surface 100b, formed on the first charge passivation layer 120 formed in the second region II.

The first charge passivation layer 120 may include an amorphous crystal structure such that the first charge passivation layer 120 is configured to improve the characteristic of the image sensor in a dark state.

When the first charge passivation layer 120 is crystallized, the grain boundary density of the first charge passivation layer 120 may vary depending on the distribution of the processing temperature, and so on of the image sensor. Because the grain boundary has a high defect density, the hot electrons are generated when the high-energy light enters the crystallized first charge passivation layer 120. The presence of the hot electrons generated as described above may result in a problem in the image sensor, such as dark current, white spot, dark shading, and so on.

In some example embodiments, if and/or when the first charge passivation layer 120 is formed to include an amorphous crystal structure, the grain boundary effect of the crystallized first charge passivation layer 120 is decreased.

That is, by forming the first charge passivation layer 120 to include the amorphous crystal structure, it is possible to at least partially mitigate the problem of the image sensor such as dark current, white spot, dark shading, and so on. As a result, a reliability of the image sensor may be improved.

The crystallization temperature of the first charge passivation layer 120 can be increased, by forming a first charge passivation layer 120 that includes a first oxide of the first metal element or metalloid element belonging to the first group and a second oxide of the second metal element or metalloid element belonging to the second group.

The first oxide of the first metal or metalloid element, and the second oxide of the second metal or metalloid element may have different crystalline structures from each other. If and/or when the compound of the first oxide and the second oxide having different crystalline structures from each other includes an amorphous crystal structure, the first oxide may reduce and/or prevent the crystallization of the amorphous second oxide, and/or the second oxide may reduce and/or prevent the crystallization of the amorphous first oxide. As a result, the crystallization temperature of the first charge passivation layer 120 may increase.

If and/or when the crystallization temperature of the first charge passivation layer 120 increases, the first charge passivation layer 120 is not easily crystallized in the subsequent process following the deposition of the first charge passivation layer 120. As a result, the first charge passivation layer 120 may be configured to resist crystallization based on the first charge passivation layer including materials configured to at least partially mitigate crystallization of each other.

Because the limits regarding the subsequent processing temperature following the deposition of the first charge passivation layer 120 decreases, the manufacture cost of the image sensor can be reduced. Further, the reliability of the image sensor against light or strong light can be improved.

Figure 4:
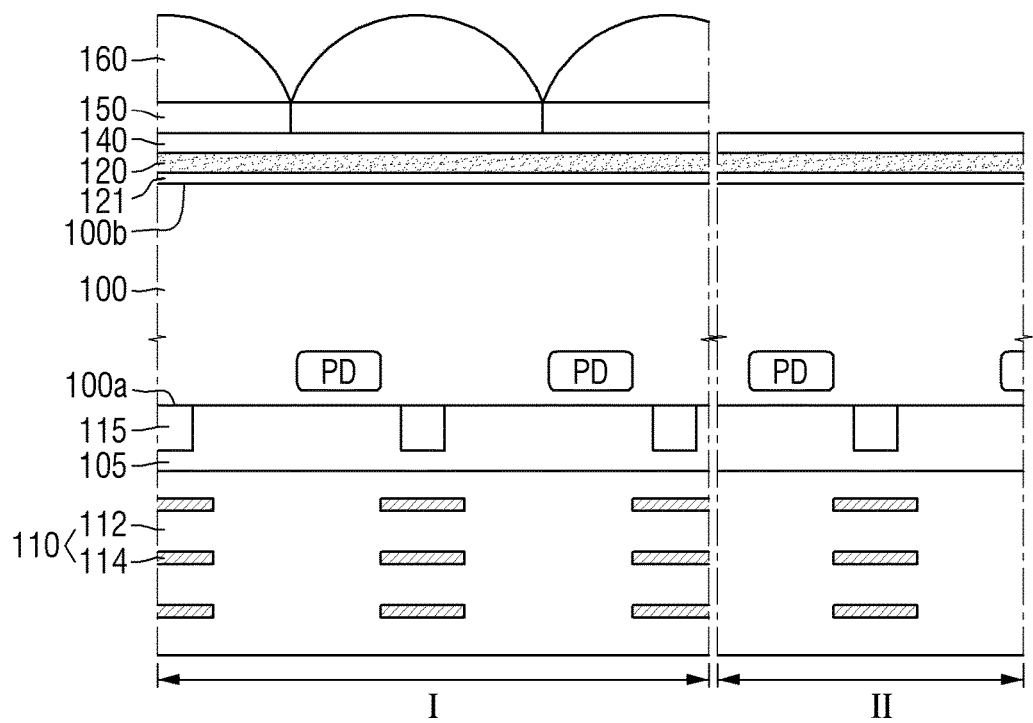
FIG. 4 is a view provided to explain an image sensor according to some example embodiments.
Figure 5:
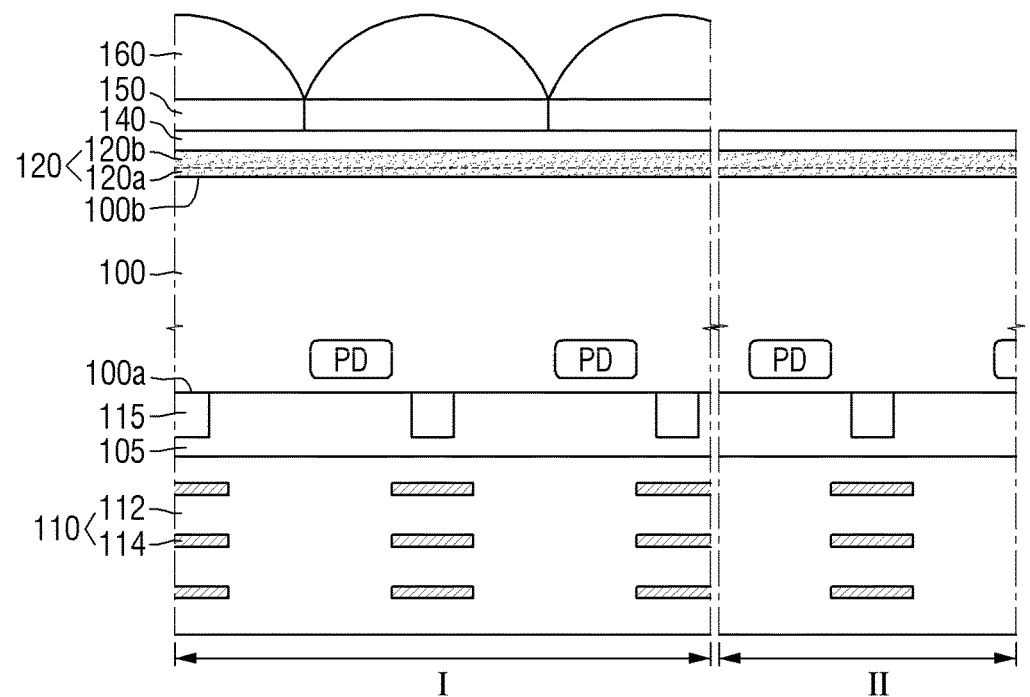
FIG. 5 is a view provided to explain an image sensor according to some example embodiments.
Figure 6:
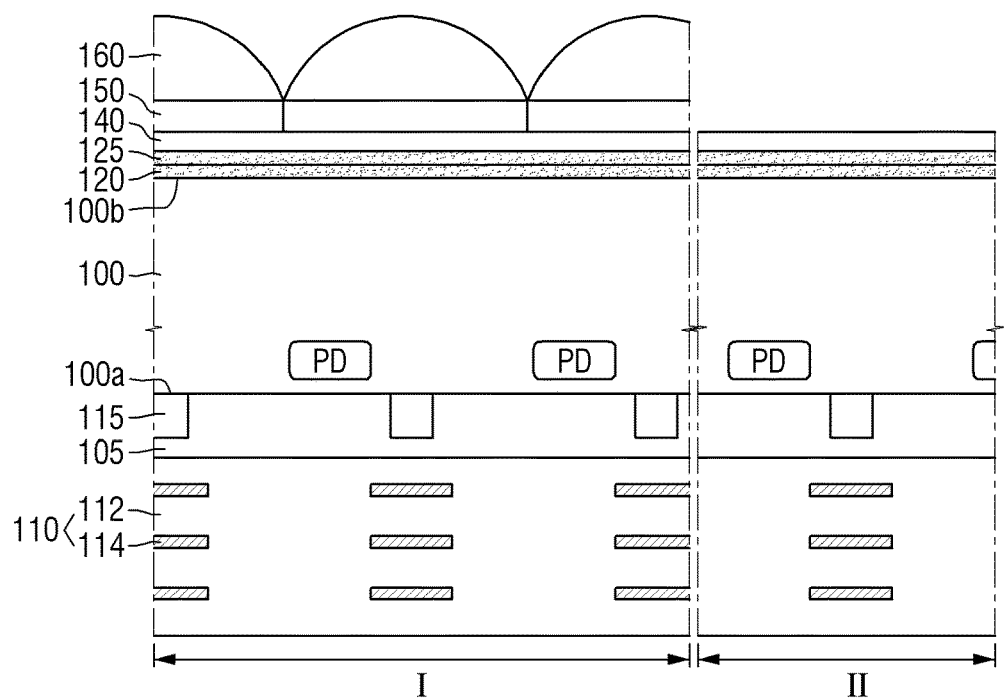
FIG. 6 is a view provided to explain an image sensor according to some example embodiments.

FIG. 4 is a view provided to explain an image sensor according to some example embodiments. FIG. 5 is a view provided to explain an image sensor according to some example embodiments. FIG. 6 is a view provided to explain an image sensor according to some example embodiments. For convenience of explanation, differences that are not explained above with reference to FIG. 3 will be mainly explained below.

Referring to FIG. 4, the image sensor according to some example embodiments may further include an insert insulating film 121 disposed between the substrate 100 and the first charge passivation layer 120.

The insert insulating film 121 may be in contact with the substrate 100 and the first charge passivation layer 120. For example, the insert insulating film 121 may be a silicon oxide film.

Referring to FIG. 5, in the image sensor according to some example embodiments, the first charge passivation layer 120 may include a first lower passivation layer 120a and a first upper passivation layer 120b.

The first upper passivation layer 120b may be formed on the first lower passivation layer 120a. The first upper passivation layer 120b may be disposed between the first lower passivation layer 120a and the color filter layer 150. In other words, the first charge passivation layer 120 may include the first lower passivation layer 120a and the first upper passivation layer 120b that are sequentially stacked on the substrate 100.

In some example embodiments, the first lower passivation layer 120a includes a first material element and the first upper passivation layer 120b includes a second material element different from the first material element. Each of the first upper passivation layer 120b and the first lower passivation layer 120a may include a high-k insulating material. The high-k insulating material included in the first upper passivation layer 120b and the high-k insulating material included in the first lower passivation layer 120a may each be an oxide that includes two or more different metal or metalloid elements.

The first upper passivation layer 120b and the first lower passivation layer 120a may include the same material. However, the stoichiometry of the high-k insulating material included in the first upper passivation layer 120b may be different from the stoichiometry of the high-k insulating material included in the first lower passivation layer 120a.

For example, the first lower passivation layer 120a and the first upper passivation layer 120b may include the compounds each including element A, element B, and oxygen (O). However, the first lower passivation layer 120a may be expressed with the chemical formula such as $A_xB_yO_z$, and the first upper passivation layer 120b may be expressed with the chemical formula such as $A_uB_vO_w$, where u, v, w, x, y and z may be a number greater than 0.

When it is stated herein that "stoichiometry is different," this means that u and x may be different from each other, v and y may be different, or w and z may be different. More specifically, when it is stated herein that "stoichiometry is different," this means that the bond ratio among the high-k insulating material elements included in the first upper passivation layer 120b is different from the bond ratio among the high-k insulating material elements included in the first lower passivation layer 120a. In some example embodiments, it may mean that the composition of the high-k insulating materials included in the first upper passivation layer 120b is different from the composition of the high-k insulating materials included in the first lower passivation layer 120a.

If and/or when the deposition method for the first lower passivation layer 120a is different from the deposition method for the first upper passivation layer 120b, the first lower passivation layer 120a and the first upper passivation layer 120b may include the same material, but the first lower passivation layer 120a and the first upper passivation layer 120b may have different stoichiometries from each other.

Depending on the deposition method as used, the bond ratio among the high-k insulating material elements included in the first upper passivation layer 120b may be different from the bond ratio among the high-k insulating material elements included in the first lower passivation layer 120a.

Referring to FIG. 6, the image sensor according to some example embodiments may further include a second charge passivation layer 125.

The second charge passivation layer 125 may be disposed on the first charge passivation layer 120. The second charge passivation layer 125 may be disposed between the first charge passivation layer 120 and the color filter layer 150.

The second charge passivation layer 125 may be disposed across (e.g., extend along, extend across, be disposed along, etc.) the first region I and the second region II. The second charge passivation layer 125 may be entirely formed in the first region I and the second region II.

The second charge passivation layer 125 may include a high-k insulating material. The second charge passivation layer 125 may include an amorphous crystal structure.

At least a portion of the high-k insulating material included in the second charge passivation layer 125 may have an amorphous crystal structure.

In the image sensor according to some example embodiments, the second charge passivation layer 125 may include a material different from the first charge passivation layer 120.

The expression "different material" as used herein represents that the elements constituting the high-k insulating material included in the second charge passivation layer 125 are different from the elements constituting the high-k insulating material included in the first charge passivation layer 120.

The second charge passivation layer 125 may include two or more different metal or metalloid elements. The high-k insulating material included in the second charge passivation layer 125 may be an oxide material that includes two or more different metal or metalloid elements.

The second charge passivation layer 125 may include an oxide material that includes at least one metal element. The second charge passivation layer 125 may include a high-k insulating material that includes at least one metal element.

The second charge passivation layer 125 may include one or more metal or metalloid elements selected from a third group of the periodic table, and one or more metal or metalloid elements selected from a fourth group of the periodic table, where the fourth group is different from the third group.

The high-k insulating material included in the second charge passivation layer 125 may include metal or metalloid elements selected from the third group of the periodic table, and metal or metalloid elements selected from the fourth group of the periodic table that is different from the third group.

The second charge passivation layer 125 may be oxide that includes at least two of hafnium (Hf), zirconium (Zr), titanium (Ti), aluminum (Al), silicon (Si), tantalum (Ta), yttrium (Y), and lanthanide, although example embodiments are not limited thereto.

The thickness of the second charge passivation layer 125 may be greater than or equal to 100 Å, for example, and less than or equal to 1000 Å.

The second charge passivation layer 125 may be associated with a refractive index (n) that is greater than or equal to 1.6, and less than or equal to 4, for example, such that the second charge passivation layer 125 is configured to reduce and/or prevent the incident light entering the second surface 100*b* of the substrate 100 from reflecting against the second charge passivation layer 125.

The first charge passivation layer 120 and the second charge passivation layer 125 may be associated with an extinction coefficient (k) that is less than or equal to 0.01, for example, such that the transmittance of the first charge passivation layer 120 and the second charge passivation layer 125 is equal to or greater than 95%.

Figure 7:
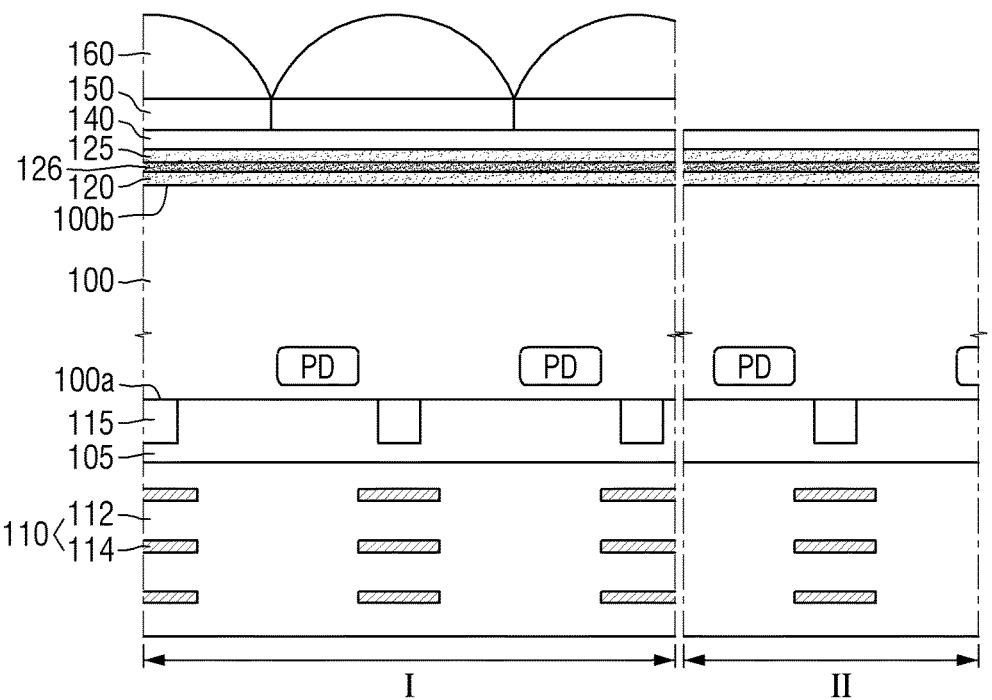
FIG. 7 is a view provided to explain an image sensor according to some example embodiments.

FIG. 7 is a view provided to explain an image sensor according to some example embodiments. For convenience of explanation, differences that are not explained above with reference to FIG. 6 will be mainly explained below.

Referring to FIG. 7, the image sensor according to some example embodiments may further include an insert passivation layer 126.

The insert passivation layer 126 may be disposed between the first charge passivation layer 120 and the second charge passivation layer 125.

For example, the insert passivation layer 126 may include at least a portion of the metal or metalloid elements included in the first charge passivation layer 120, and at least a portion of the metal or metalloid elements included in the second charge passivation layer 125.

The metal or metalloid elements included in the first charge passivation layer 120 may be element A and element B, and the metal or metalloid elements included in the second charge passivation layer 125 may be element C and element D. In this case, the insert passivation layer 126 may include elements A, B, C and D, or elements A, B and C, or elements A, B and D, or elements A, C and D, or elements B, C and D.

Figure 8:
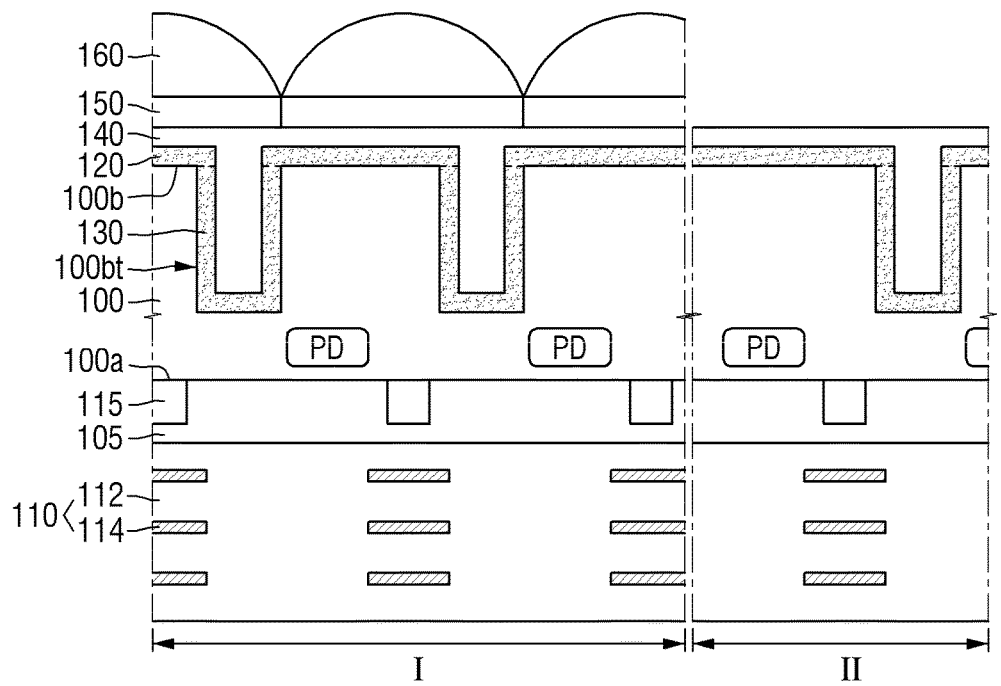
FIG. 8 is a view provided to explain an image sensor according to some example embodiments.

FIG. 8 is a view provided to explain an image sensor according to some example embodiments. For convenience of explanation, differences that are not explained above with reference to FIG. 3 will be mainly explained below.

Referring to FIG. 8, the image sensor according to some example embodiments may further include a first trench charge passivation layer 130.

A first trench 100*bt* may be formed within the substrate 100. The first trench 100*bt* may be formed adjacent to the second surface 100*b* of the substrate 100, such that the first trench 100*bt* extends towards the first surface 100*a* from the second surface 100*b*. More specifically, the first trench 100*bt* may extend from the second surface 100*b* of the substrate 100 in a thickness direction of the substrate 100 (e.g., extend into an interior of the substrate 100).

The first trench 100*bt* extends toward the first surface 100*a* of the substrate 100, but does not reach the first surface 100*a* of the substrate 100 (e.g., the first trench 100*bt* is isolated from the first surface 100*a* by at least a portion of the substrate 100). That is, the bottom surface of the first trench 100*bt* may be positioned between the first surface 100*a* of the substrate 100 and the second surface 100*b* of the substrate 100, such that the bottom surface of the first trench 100*bt* is isolated from the second surface 100*b* by at least a portion of the substrate 100.

As shown in FIG. 8, the first trench charge passivation layer 130 may be disposed on at least one sidewall and the bottom surface of the first trench 100*bt*. The first trench charge passivation layer 130 includes a portion extending along at least one sidewall of the first trench 100*bt*, and a portion extending along the bottom surface of the first trench 100*bt*.

The first trench charge passivation layer 130 may be in contact with the first charge passivation layer 120. As shown in FIG. 8, in some example embodiments, a portion of the first trench charge passivation layer 130 that extends along the sidewall of the first trench 100*bt* may be in direct contact with a portion of the first charge passivation layer 120 that extends along the second surface 100*b* of the substrate 100.

The first trench charge passivation layer 130 is disposed in not only the first region I, but also the second region II.

The first trench charge passivation layer 130 may include a high-k insulating material. The first trench charge passivation layer 130 may include an amorphous crystal structure.

In the image sensor according to some example embodiments, the first trench charge passivation layer 130 may include the same material (e.g., a common material) as the first charge passivation layer 120.

The first trench charge passivation layer 130 and the first charge passivation layer 120 may be formed at the same level. The term "same level" as used herein refers to being formed by a same fabricating process. For example, the first trench charge passivation layer 130 and the first charge passivation layer 120 may be formed simultaneously.

Although FIG. 8 illustrates that the first trench charge passivation layer 130 is formed conformally along the sidewall and the bottom surface of the first trench 100*bt*, this is provided only for convenience of explanation and example embodiments are not limited to any specific examples only.

The planarization film 140 may fill the rest of the first trench 100*bt* in which the first trench charge passivation layer 130 is formed.

Figure 9:
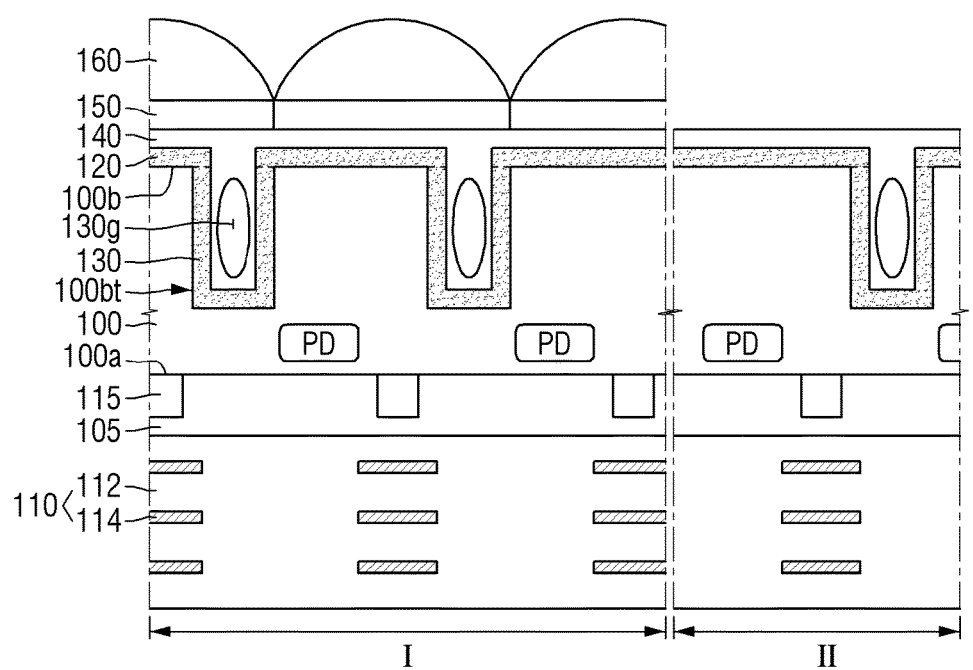
FIG. 9 is a view provided to explain an image sensor according to some example embodiments.

FIG. 9 is a view provided to explain an image sensor according to some example embodiments. For convenience of explanation, differences that are not explained above with reference to FIG. 8 will be mainly explained below.

Referring to FIG. 9, the image sensor according to some example embodiments may further include a trench air gap 130*g* at least partially defined by one or more materials included in the first trench 100*bt*.

The trench air gap 130*g* may be formed within the first trench 100*bt*. The trench air gap 130*g* may be defined by the planarization film 140. The trench air gap 130*g* may be surrounded by the planarization film 140.

When the gap-fill capability of the planarization film 140 is low, the planarization film 140 may fill only a portion of the first trench 100*bt*. As a result, the trench air gap 130*g* may be formed within the first trench 100*bt*, such that the trench air gap 130*g* is at least partially defined by the planarization film 140.

Figure 10:
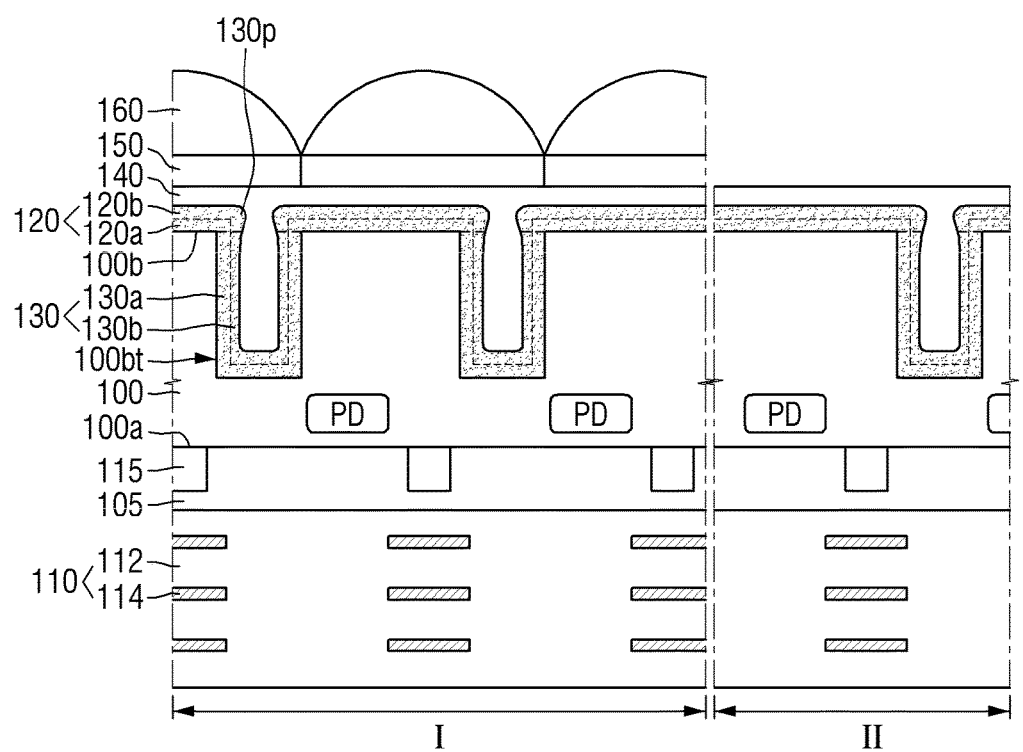
FIG. 10 is a view provided to explain an image sensor according to some example embodiments.

FIG. 10 is a view provided to explain an image sensor according to some example embodiments. For convenience of explanation, differences from the example embodiments explained above with reference to FIGS. 5 and 8 will be mainly explained below.

Referring to FIG. 10, in the image sensor according to some example embodiments, the first charge passivation layer 120 may include a first lower passivation layer 120*a* (e.g., a first layer portion of the first charge passivation layer 120) and a first upper passivation layer 120*b* (e.g., a second layer portion of the first charge passivation layer 120), and the first trench charge passivation layer 130 may include a first lower trench passivation layer 130*a* and a first upper trench passivation layer 130*b*.

The first lower passivation layer 120a and the first upper passivation layer 120b may be formed sequentially along the second surface 100b of the substrate 100. The first lower trench passivation layer 130a and the first upper trench passivation layer 130b may be formed sequentially on the sidewall and the bottom surface of the first trench 100bt.

For example, the first lower passivation layer 120a and the first lower trench passivation layer 130a may be formed at the same level (e.g., formed as part of a common process, formed simultaneously, some combination thereof, etc.). Further, the first upper passivation layer 120b and the first upper trench passivation layer 130b may be formed at the same level (e.g., formed as part of a common process, formed simultaneously, some combination thereof, etc.).

Accordingly, the first lower passivation layer 120a, the first upper passivation layer 120b, the first lower trench passivation layer 130a, and the first upper trench passivation layer 130b may include the same material (e.g., a common material).

The first lower passivation layer 120a and the first lower trench passivation layer 130a may be formed by using the same (e.g., a common) deposition method. The first lower passivation layer 120a and the first lower trench passivation layer 130 in contact with each other may extend along the second surface 100b of the substrate 100, and along the sidewall and the bottom surface of the first trench 100bt.

The first upper passivation layer 120b and the first upper trench passivation layer 130b may be formed by using the same deposition method. The first upper passivation layer 120b and the first upper trench passivation layer 130b in contact with each other may extend along a profile of the first lower passivation layer 120a and the first lower trench passivation layer 130a.

The deposition method used to form the first upper passivation layer 120b may be different from the deposition method used to form the first lower passivation layer 120a.

If and/or when the deposition method used to form the first upper passivation layer 120b is different from the deposition method used to form the first lower passivation layer 120a, the stoichiometry of the high-k insulating material included in the first lower passivation layer 120a and the first lower trench passivation layer 130a may be different from the stoichiometry of the high-k insulating material included in the first upper passivation layer 120b and the first upper trench passivation layer 130b.

As shown in FIG. 10, if and/or when the step coverage of the deposition method for forming the first upper passivation layer 120b is bad, the first trench charge passivation layer 130 and/or the first charge passivation layer 120 may include an overhang structure 130p near the uppermost portion of the first trench 100bt.

The overhang structure 130p shown in FIG. 10 may not appear when the deposition method for forming the first upper passivation layer 120b and/or the deposition method for forming the first lower passivation layer 120a have a good step coverage.

In some example embodiments, even when the deposition method for forming the first upper passivation layer 120b is different from the deposition method for forming the first lower passivation layer 120a, the stoichiometry of the high-k insulating material included in the first lower passivation layer 120a and the first lower trench passivation layer 130a may be substantially the same (e.g., the same within manufacturing tolerances and/or material tolerances) as the stoichiometry of the high-k insulating material included in the first upper passivation layer 120b and the first upper trench passivation layer 130b.

In some example embodiments, the first lower passivation layer 120a and the first upper passivation layer 120b may be formed by the same deposition method. If and/or when the first lower passivation layer 120a and the first upper passivation layer 120b are formed by the same deposition method, the stoichiometry of the high-k insulating material included in the first lower passivation layer 120a and the first lower trench passivation layer 130a is the same as the stoichiometry of the high-k insulating material included in the first upper passivation layer 120b and the first upper trench passivation layer 130b.

In such example embodiments, when the step coverage of the deposition method for forming the first lower passivation layer 120a and the first upper passivation layer 120b is bad, the first trench charge passivation layer 130 and/or the first charge passivation layer 120 may have an overhang structure 130p near the uppermost portion of the first trench 100bt.

Figure 11:
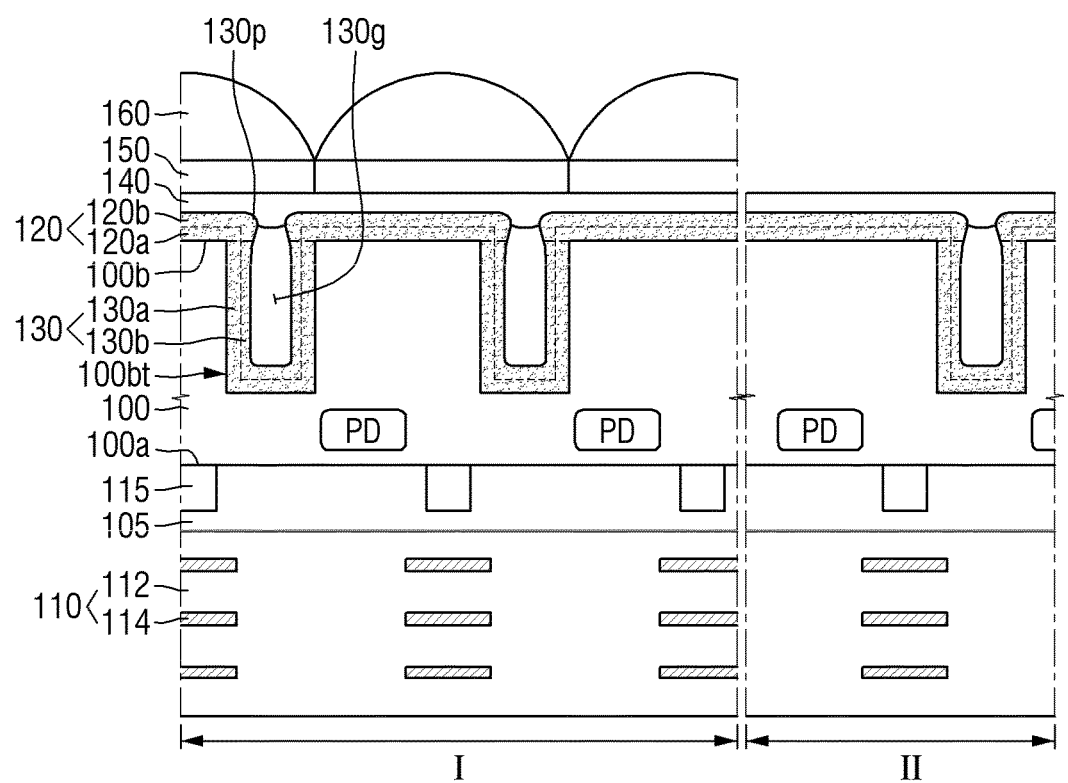
FIG. 11 is a view provided to explain an image sensor according to some example embodiments.
Figure 12:
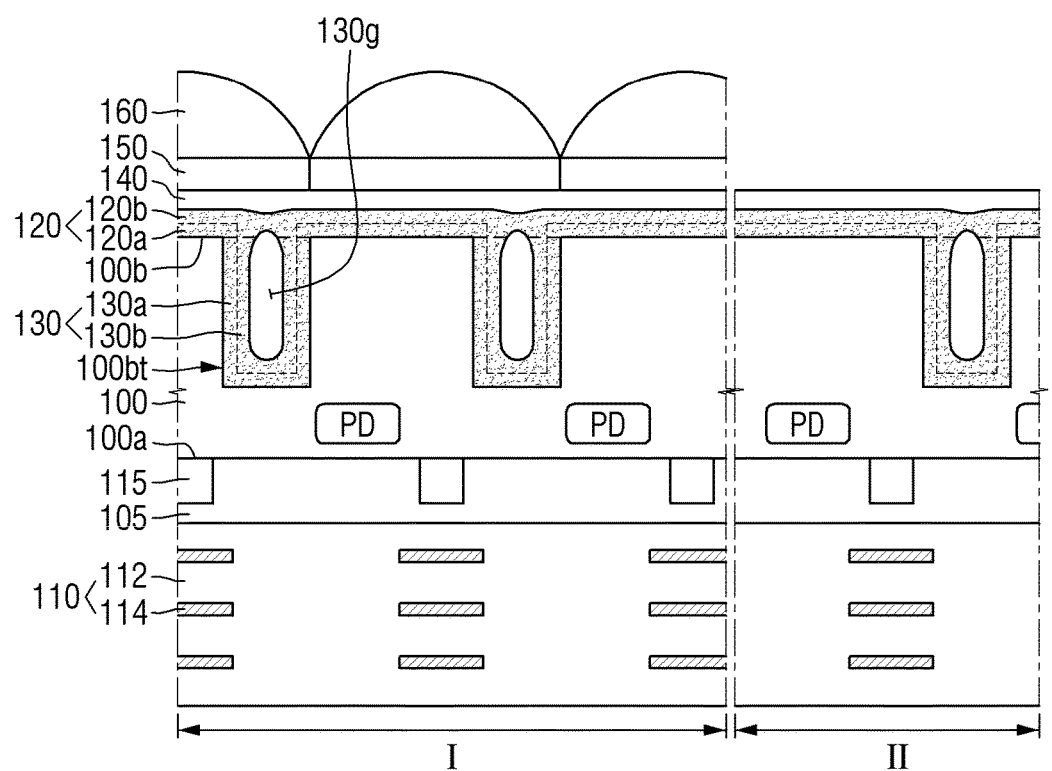
FIG. 12 is a view provided to explain an image sensor according to some example embodiments.

FIG. 11 is a view provided to explain an image sensor according to some example embodiments. FIG. 12 is a view provided to explain an image sensor according to some example embodiments. For convenience of explanation, differences that are not explained above with reference to FIG. 10 will be mainly explained below.

Referring to FIG. 11, the image sensor according to some example embodiments may further include a trench air gap 130g at least partially defined by the first trench 100bt, one or more materials included therein, some combination thereof, or the like.

The trench air gap 130g may be formed within the first trench 100bt. The trench air gap 130g may be defined by the planarization film 140 and the first trench charge passivation layer 130. The trench air gap 130g may be surrounded by the planarization film 140 and the first trench charge passivation layer 130.

The width of the uppermost portion of the first trench 100bt may be reduced due to the overhang structure 130p formed near the uppermost portion of the first trench 100bt. As a result, the planarization film 140 may fill only the upper portion of the first trench 100bt where the overhang structure 130p is formed. Accordingly, the trench air gap 130g may be formed within the first trench 100bt.

Referring to FIG. 12, in the image sensor according to some example embodiments, the first trench charge passivation layer 130 may include a trench air gap 130g at least partially defined by the first trench 100bt, one or more materials included therein, some combination thereof, or the like.

The trench air gap 130g may be defined by the first trench charge passivation layer 130. The trench air gap 130g may be surrounded by the first trench charge passivation layer 130.

While the first upper passivation layer 120b and the first upper trench passivation layer 130b are being deposited, the first upper passivation layer 120b formed on the upper portion of the first trench 100bt and/or the first upper trench passivation layer 130b may be connected to each other. As a result, the trench air gap 130g may be formed within the first trench charge passivation layer 130.

Figure 13:
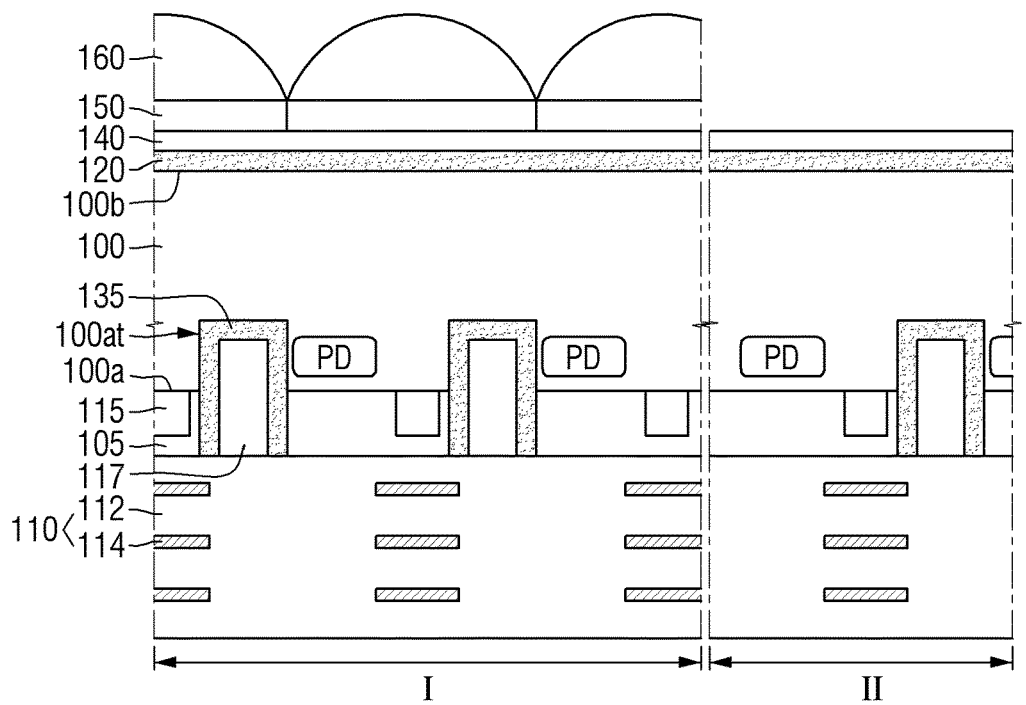
FIG. 13 is a view provided to explain an image sensor according to some example embodiments.

FIG. 13 is a view provided to explain an image sensor according to some example embodiments. For convenience of explanation, differences that are not explained above with reference to FIG. 3 will be mainly explained below.

Referring to FIG. 13, the image sensor according to some example embodiments may further include a second trench charge passivation layer 135.

A second trench 100*at* may be formed within the substrate 100. The second trench 100*at* may be formed adjacent to the first surface 100*a* of the substrate 100, such that the second trench 100*at* extends into the substrate 100 from the first surface 100*a*. The second trench 100*at* may be formed within the pre-metal dielectric film layer 105 and the substrate 100. A portion of a sidewall of the second trench 100*at* may extend from the first surface 100*a* of the substrate 100 in the thickness direction of the substrate 100.

The second trench 100*at* extends toward the second surface 100*b* of the substrate 100, but does not reach the second surface 100*b* of the substrate 100 (e.g., is isolated from direct contact with the second surface 100*b* by at least a portion of the substrate 100). That is, the bottom surface of the second trench 100*at* may be positioned between the first surface 100*a* of the substrate 100 and the second surface 100*b* of the substrate 100.

The second trench charge passivation layer 135 may be disposed on at least one sidewall and the bottom surface of the second trench 100*at*. The second trench charge passivation layer 135 includes a portion extending along a sidewall of the second trench 100*at*, and a portion extending along the bottom surface of the second trench 100*at*.

The second trench charge passivation layer 135 is disposed in not only the first region I, but also the second region II.

In the image sensor according to some example embodiments, the second trench charge passivation layer 135 is not in contact with the first charge passivation layer 120 (e.g., is isolated from the first charge passivation layer 120).

For example, the second trench charge passivation layer 135 may include a high-k insulating material. Further, the second trench charge passivation layer 135 may include an amorphous crystal structure.

More specifically, at least a portion of the high-k insulating material included in the second trench charge passivation layer 135 may have an amorphous crystal structure.

The second trench charge passivation layer 135 may include two or more different metal or metalloid elements. The high-k insulating material included in the second trench charge passivation layer 135 may be oxide that includes two or more different metal or metalloid elements.

The second trench charge passivation layer 135 may include an oxide material that includes at least one metal element. The second trench charge passivation layer 135 may include a high-k insulating material that includes at least one metal element.

The second trench charge passivation layer 135 may include one or more metal or metalloid elements selected from the fifth group of the periodic table, and one or more metal or metalloid elements selected from the sixth group of the periodic table, where the sixth group is different from the fifth group.

The high-k insulating material included in the second trench charge passivation layer 135 may include metal or metalloid elements selected from the fifth group, and metal or metalloid elements selected from the sixth group of the periodic table that is different from the fifth group.

For example, the second trench charge passivation layer 135 may be oxide that includes at least two of hafnium (Hf), zirconium (Zr), titanium (Ti), aluminum (Al), silicon (Si), tantalum (Ta), yttrium (Y), and lanthanide, although example embodiments are not limited thereto.

The second trench charge passivation layer 135 may include the same material as the first charge passivation layer 120, or may include different material.

A filling film 117 may fill the second trench 100*at* where the second trench charge passivation layer 135 is formed. The filling film 117 may include a material having a good gap-fill capability.

Figure 14:
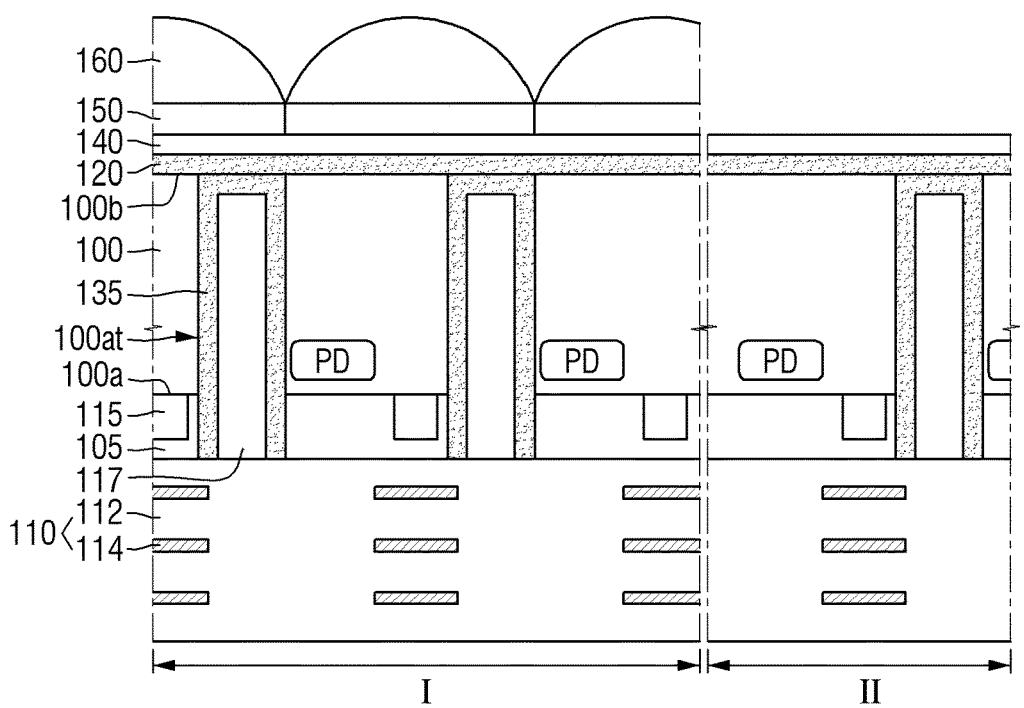
FIG. 14 is a view provided to explain an image sensor according to some example embodiments.
Figure 15:
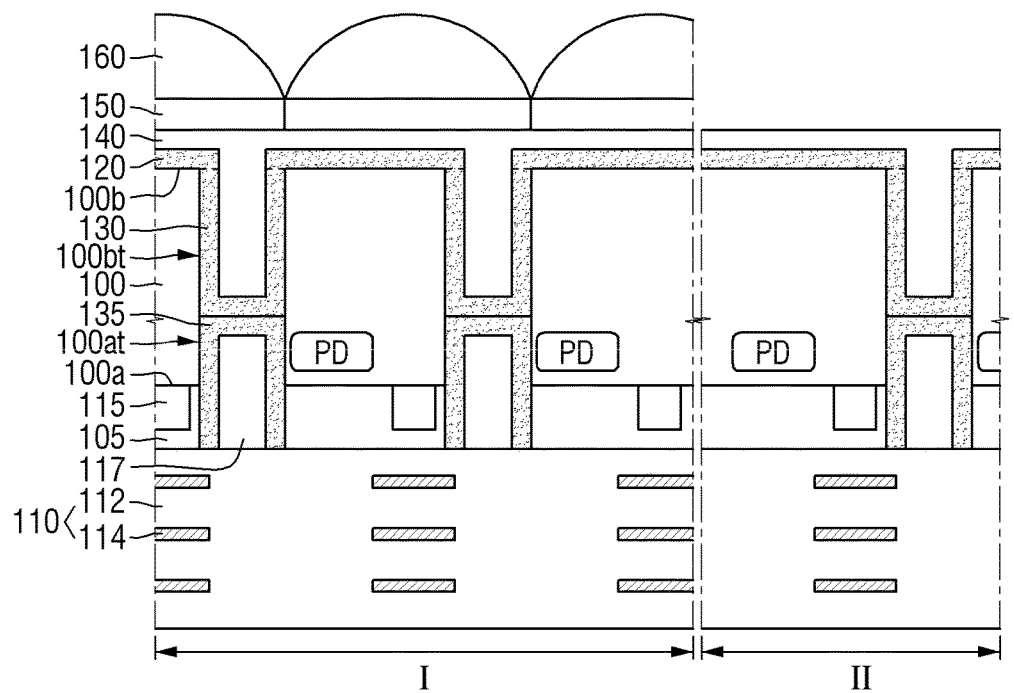
FIG. 15 is a view provided to explain an image sensor according to some example embodiments.

FIG. 14 is a view provided to explain an image sensor according to some example embodiments. FIG. 15 is a view provided to explain an image sensor according to some example embodiments. For convenience of explanation, differences that are not explained above with reference to FIG. 13 will be mainly explained below.

Referring to FIG. 14, in the image sensor according to some example embodiments, the second trench 100*at* may extend from the first surface 100*a* to the second surface 100*b* of the substrate 100.

That is, at least a portion of the sidewall of the second trench 100*at* may extend from the first surface 100*a* of the substrate 100 to the second surface 100*b* of the substrate 100.

The second trench charge passivation layer 135 may be in contact with the first charge passivation layer 120.

Referring to FIG. 15, the image sensor according to some example embodiments may further include a first trench 100*bt* formed within the substrate 100, and a first trench charge passivation layer 130.

The first trench 100*bt* extends toward the first surface 100*a* of the substrate 100, but does not reach the first surface 100*a* of the substrate 100 (e.g., is isolated from the first surface 100*a*).

The first trench charge passivation layer 130 may be disposed on the sidewall and the bottom surface of the first trench 100*bt*.

In the image sensor according to some example embodiments, the first trench charge passivation layer 130 extends along a sidewall and the bottom surface of the first trench 100*bt* may be in contact with the second trench charge passivation layer 135 extending along a sidewall and the bottom surface of the second trench 100*at*.

As illustrated in FIG. 15, it is illustrated that a width of the bottom surface of the first trench 100*bt* may be equal to the width of the bottom surface of the second trench 100*at*, and a sidewall of the first trench 100*bt* and a sidewall of the second trench 100*at* may be connected with each other, although these are provided only for the purpose of convenience of explanation, and example embodiments are not limited to any specific example.

That is, the bottom surface of the first trench 100*bt* may be overlapped with a portion of the bottom surface of the second trench 100*at*. Further, a width of the bottom surface of the first trench 100*bt* may be different from the width of the bottom surface of the second trench 100*at*. Moreover, a sidewall of the first trench 100*bt* may not be aligned with a sidewall of the second trench 100*at*.

The second trench charge passivation layer 135 may include the same material as the first trench charge passivation layer 130, or may include different material.

Figure 16:
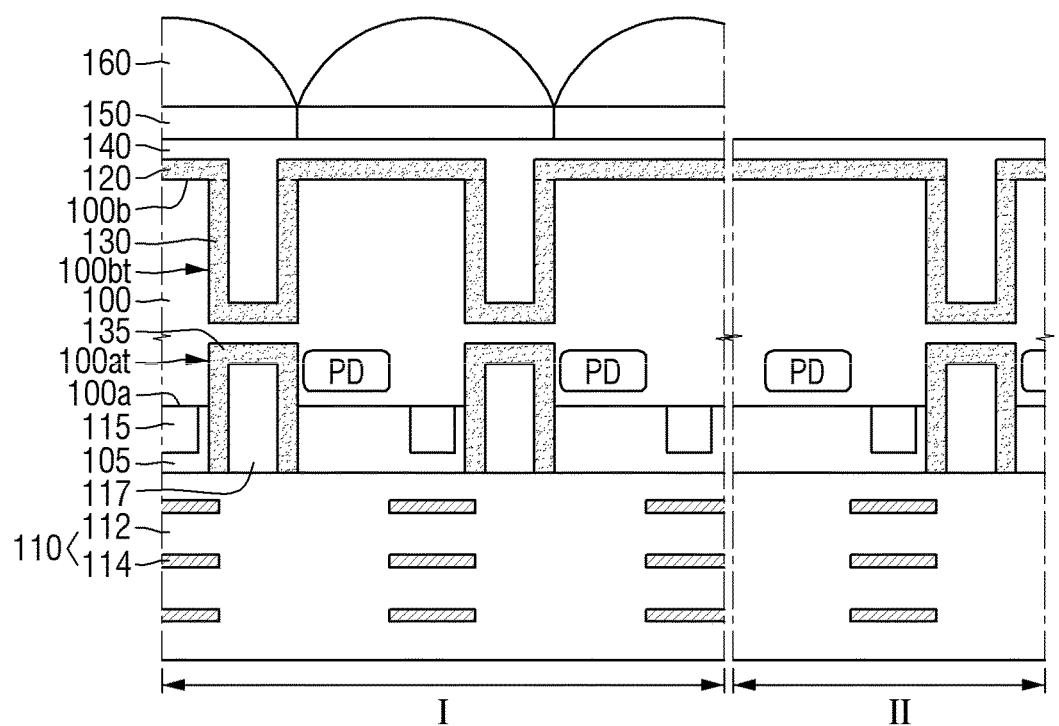
FIG. 16 is a view provided to explain an image sensor according to some example embodiments.

FIG. 16 is a view provided to explain an image sensor according to some example embodiments. For convenience of explanation, differences that are not explained above with reference to FIG. 15 will be mainly explained below.

Referring to FIG. 16, in the image sensor according to example embodiments, a portion of the substrate 100 may be interposed between the first trench charge passivation layer 130 formed on the bottom surface of the first trench 100*bt* and the second trench charge passivation layer 135 formed on the bottom surface of the second trench 100*at*.

That is, the first trench charge passivation layer 130 may be spaced apart from (e.g., isolated from) the second trench charge passivation layer 135 by at least a portion of the substrate 100.

As illustrated in FIGS. 9, 11, and 12, those skilled in the art will be able to understand that the trench air gap may be formed within the second trench 100at.

Figure 17:
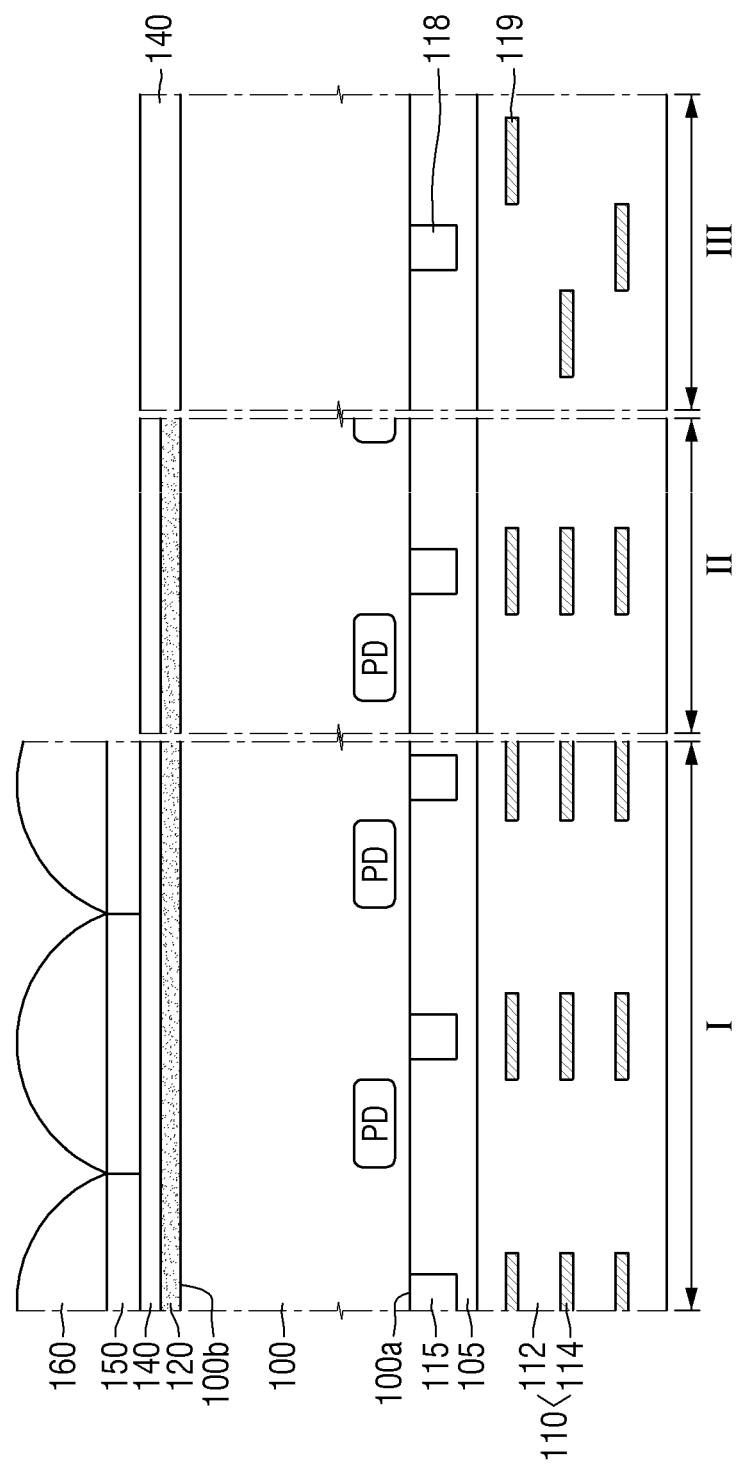
FIG. 17 is a view provided to explain an image sensor according to some example embodiments.

FIG. 17 is a view provided to explain an image sensor according to some example embodiments. For convenience of explanation, differences that are not explained above with reference to FIG. 3 will be mainly explained below.

Referring to FIG. 17, an image sensor according to some example embodiments may include a first region I, a second region II, and a third region III.

The first charge passivation layer 120 may extend across an entirety of the first region I and the second region II. However, the first charge passivation layer 120 may not extend across the third region III.

The first region I may be a sensing region, the second region II may be an optical black region, or, OB region, and the third region III may be a peripheral region. The third region III may be the peripheral region of the first region I and the second region II where the sensor array 10 of FIG. 1 is formed.

A first gate 115 may be disposed on the first surface 100a of the substrate 100 that corresponds to the first region I and the second region II, and a second gate 118 may be disposed on the first surface 100a of the substrate 100 that corresponds to the third region III. Unlike the first gate 115, the second gate 118 may configure the image sensor to perform one or more operations, receive and/or transmit signals, some combination thereof, or the like.

An insulating structure 110 is formed such that the insulating structure 110 not only extends on a portion of the first surface 100a of the substrate 100 that corresponds to the first region I and the second region II, but also extends on a portion of the first surface 100a of the substrate 100 that corresponds to the third region III. The insulating structure 110 includes not only the first metal wiring 114 formed in the first region I and the second region II, but also the second metal wiring 119 formed in the third region III. The second metal wiring 119 may include a plurality of wirings formed at the same level as a plurality of wirings included in the first metal wiring 114.

As illustrated in FIG. 17, the planarization film 140 may be formed on the second surface 100b of the substrate 100 of the third region III, although example embodiments are not limited to specific example only.

Figure 18:
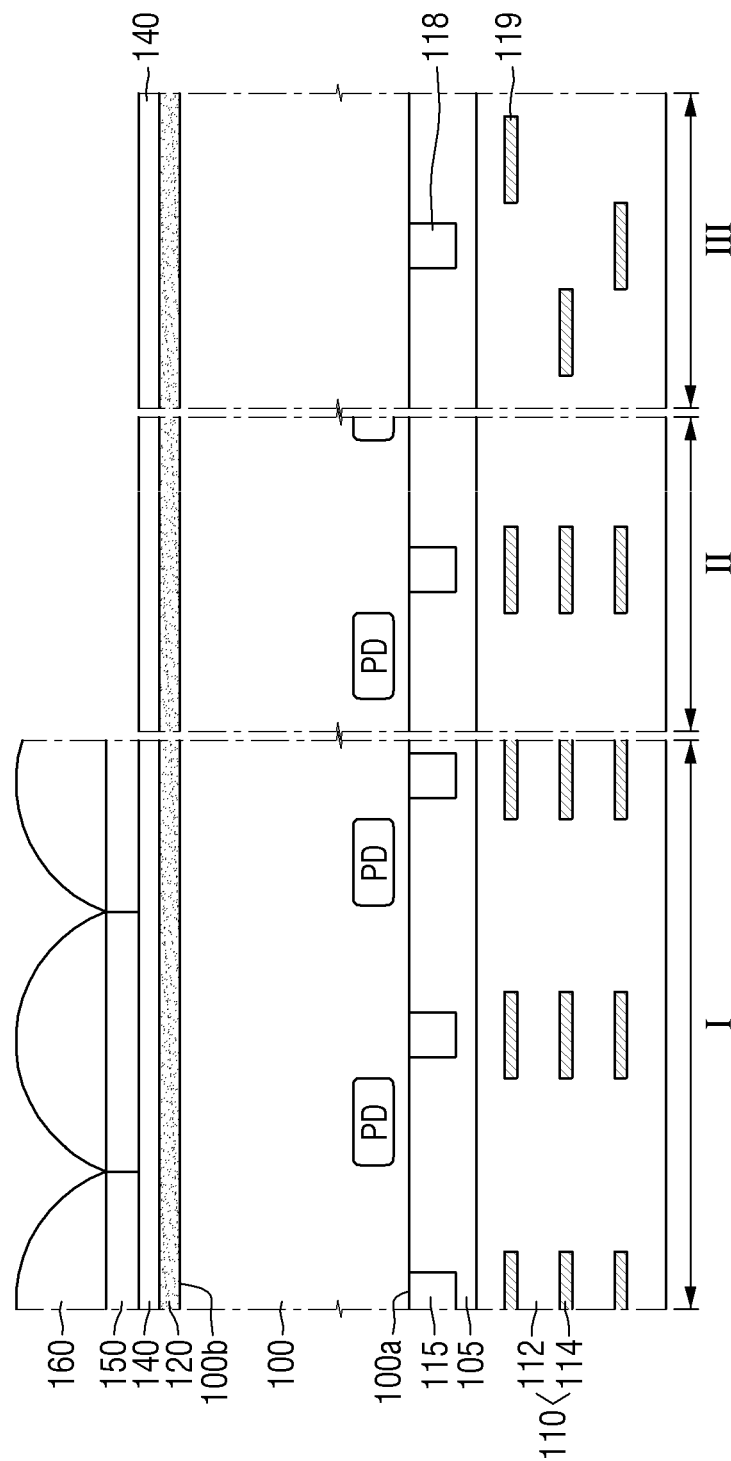
FIG. 18 is a view provided to explain an image sensor according to some example embodiments.

FIG. 18 is a view provided to explain an image sensor according to some example embodiments. For convenience of explanation, differences that are not explained above with reference to FIG. 17 will be mainly explained below.

Referring to FIG. 18, in the image sensor according to some example embodiments, the first charge passivation layer 120 may extend to the third region III.

The first charge passivation layer 120 may be formed on at least a portion of the second surface 100b of the substrate 100 of the third region III.

FIGS. 19 to 23 are views illustrating intermediate stages of fabrication, provided to explain a method of fabricating an image sensor according to some example embodiments. For reference, a method of fabricating an image sensor will be described mainly with reference to the first region I of FIG. 3.

Figure 19:
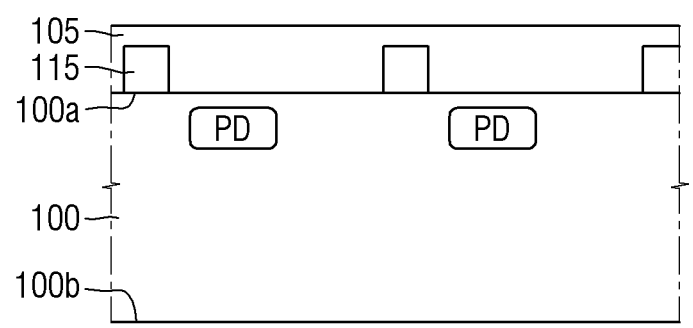
FIG. 19, FIG. 20, FIG. 21, FIG. 22A, FIG. 22B, FIG. 22C, and FIG. 23 are views illustrating intermediate stages of fabrication, provided to explain a method of fabricating an image sensor according to some example embodiments.

Referring to FIG. 19, a photoelectric conversion device PD may be formed within the substrate 100 that includes the first surface 100a and the second surface 100b opposite to each other.

A first gate 115 may be formed on the first surface 100a of the substrate 100. A pre-metal dielectric film layer 105 may be formed on the first surface 100a of the substrate 100, while overlying the first gate 115.

Figure 20:
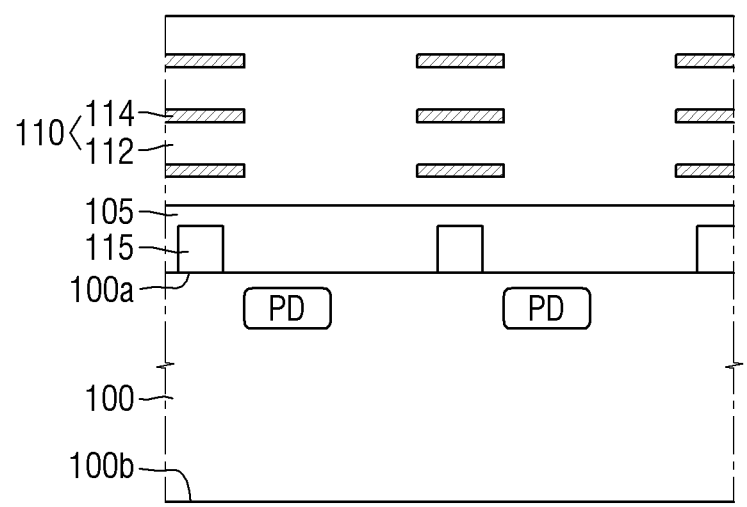

Referring to FIG. 20, the insulating structure 110 including the interlayer insulating film 112 and the first metal wiring 114 may be formed on the pre-metal dielectric film layer 105.

Figure 21:
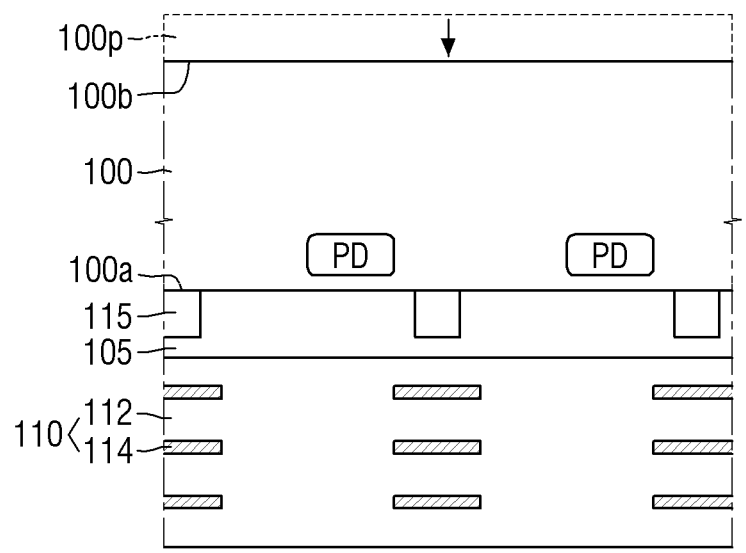

Referring to FIG. 21, a portion 100p of the substrate 100 may be removed to reduce the thickness of the substrate 100.

The substrate 100 is inverted such that the second surface 100b of the substrate 100 is faced upward. The planarization etching is performed such that a portion of the substrate 100 is removed.

Figure 22A:
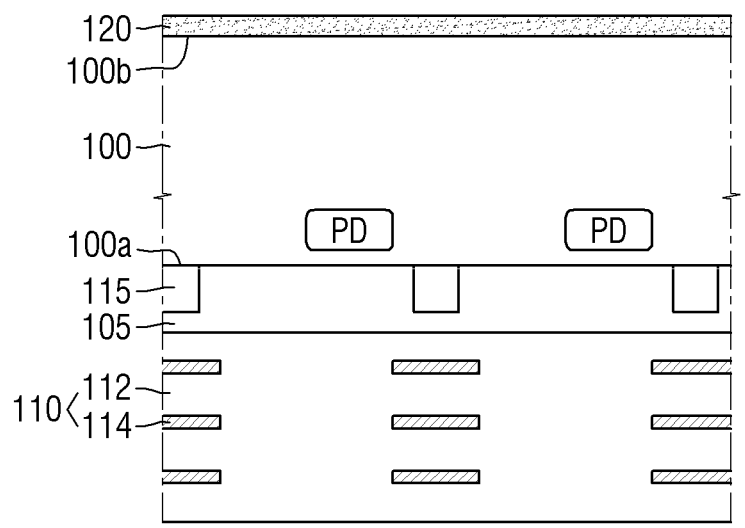
Figure 22B:
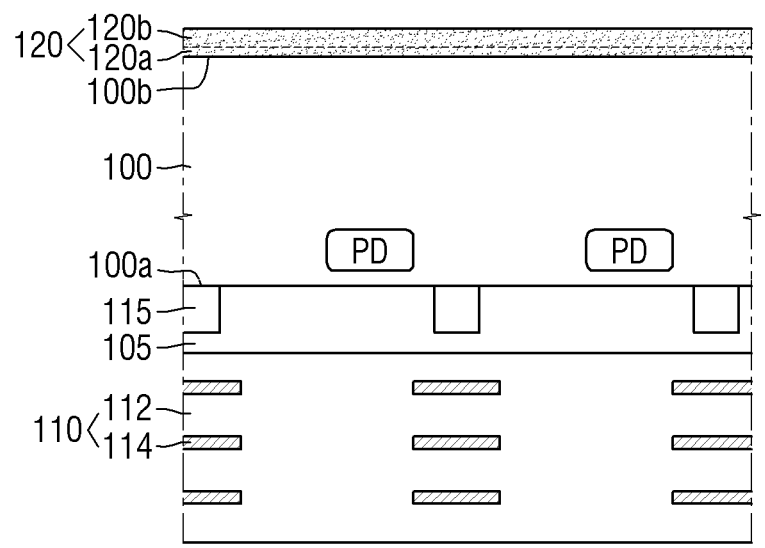
Figure 22C:
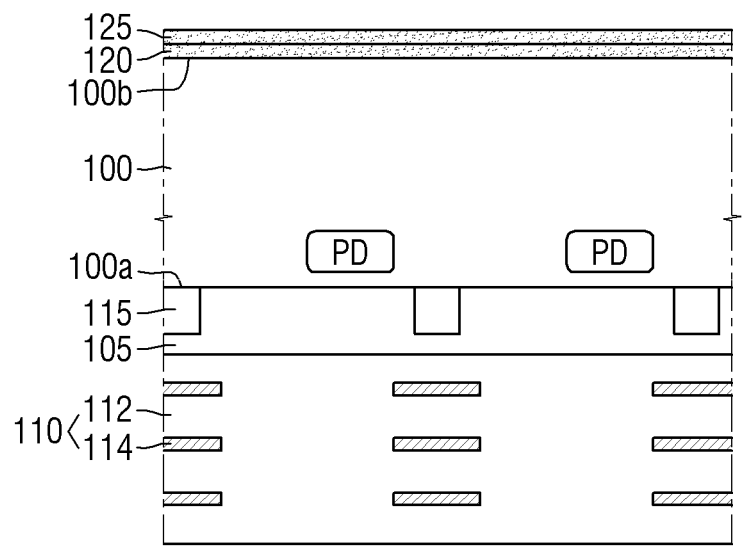

Referring to FIGS. 22A to 22C, the first charge passivation layer 120 may be formed on the second surface 100b of the substrate 100.

For example, the first charge passivation layer 120 may be formed with at least one of atomic layer deposition (ALD), physical vapor deposition (PVD), and chemical vapor deposition (CVD).

In FIG. 22A, the first charge passivation layer 120 may be formed with one single deposition method. More specifically, the first charge passivation layer 120 may be formed with at least one of atomic layer deposition (ALD), physical vapor deposition (PVD), and chemical vapor deposition (CVD), for example.

In some example embodiments, the first charge passivation layer 120 may be formed with ALD. In some example embodiments, the first charge passivation layer 120 may be oxide having chemical formula $A_xB_yO_z$.

In some example embodiments, if and/or when ALD is used to form the first charge passivation layer 120, element A and oxygen O are formed sequentially such that a layer having a chemical formula AO is deposited on the second surface 100b of the substrate 100. Element B and oxygen O are then sequentially formed such that a layer having a chemical formula BO may be formed on the layer having chemical formula AO.

As a result of repeating the processes mentioned above, the first charge passivation layer 120 may be formed. Note that the number of depositing the layer with chemical formula AO and the layer with chemical formula BO may be adjusted in consideration of the ratio of element A and element B included in the first charge passivation layer 120.

In some example embodiments, the first charge passivation layer 120 may be formed with PVD.

According to PVD, the first charge passivation layer 120 may be deposited on the second surface 100b of the substrate 100, using a deposition target including element A and a deposition target including element B in an oxygen atmosphere chamber. In some example embodiments, the first charge passivation layer 120 may be deposited on the second surface 100b of the substrate 100, using a deposition target including an oxide of element A, and a deposition target including an oxide of element B.

In some example embodiments, the first charge passivation layer 120 may be formed with CVD.

According to CVD, the first charge passivation layer 120 may be deposited on the second surface 100b of the substrate 100, using a precursor including element A, a precursor including element B, and a precursor including oxygen.

The ratio among the precursor including element A, the precursor including element B, and the precursor including oxygen may be adjusted in consideration of the ratio between element A and element B included in the first charge passivation layer 120.

The deposition rate of the first charge passivation layer 120 may vary depending on the deposition method used for forming the first charge passivation layer 120. In some example embodiments, because the step coverage varies depending on the deposition method used, the shape into which the first charge passivation layer 120 is formed may also vary.

In FIG. 22B, the first charge passivation layer 120 may include a first lower passivation layer 120a and a first upper passivation layer 120b. The first lower passivation layer 120a may be formed with a first deposition method, and the first upper passivation layer 120b may be formed with a second deposition method different from the first deposition method.

The first lower passivation layer 120a may serve as a seed layer to form the first upper passivation layer 120b. The first lower passivation layer 120a may be formed densely on the second surface 100b of the substrate 100 so that the first lower passivation layer 120a serves as a seed layer.

In some example embodiments, the first lower passivation layer 120a may be formed with the deposition method having a relatively lower deposition rate. In some example embodiments, the first deposition method for forming the first lower passivation layer 120a may be ALD.

In some example embodiments, if and/or when the first charge passivation layer 120 is formed entirely with ALD, the deposition time of the first charge passivation layer 120 may be lengthened. When the deposition rate is slowed, the yield may be decreased.

In some example embodiments, the first upper passivation layer 120b may be formed on the first lower passivation layer 120a using the second deposition method with faster deposition rate than the first deposition method, after the first lower passivation layer 120a as a seed layer is formed. For example, the first upper passivation layer 120b may be formed with PVD, although example embodiments are not limited thereto.

The first lower passivation layer 120a and the first upper passivation layer 120b may include the same material, but the first lower passivation layer 120a and the first upper passivation layer 120b may be different in the deposition methods thereof.

In some example embodiments, the stoichiometry of the first lower passivation layer 120a may be different from the stoichiometry of the first upper passivation layer 120b.

In FIG. 22C, the second charge passivation layer 125 may be additionally formed on the first charge passivation layer 120. The first charge passivation layer 120 may include different material from the second charge passivation layer 125.

In some example embodiments, the second charge passivation layer 125 may be formed with at least one of atomic layer deposition (ALD), physical vapor deposition (PVD), and chemical vapor deposition (CVD).

This will be described with reference to FIG. 22A.

Figure 23:
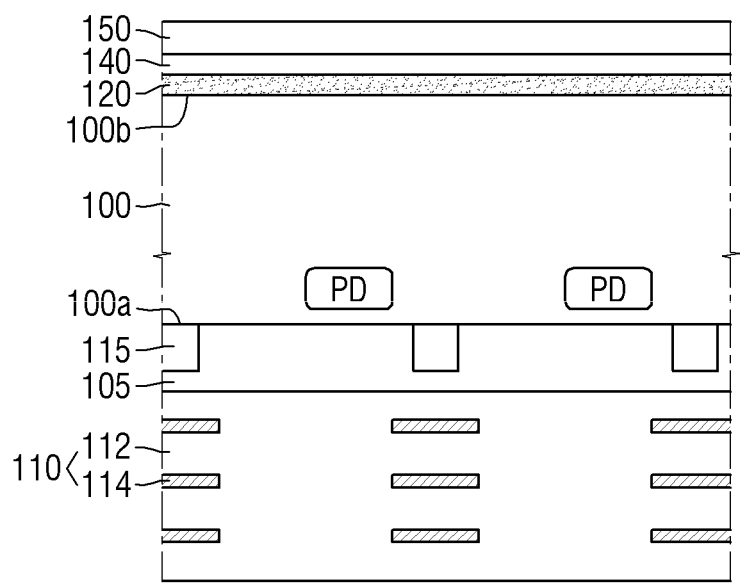

Referring to FIG. 23, a planarization film 140 may be formed on the first charge passivation layer 120. A color filter layer 150 may be formed on the planarization film 140.

Referring to FIG. 3, a microlens 160 may be formed on the color filter layer 150.

Figure 24:
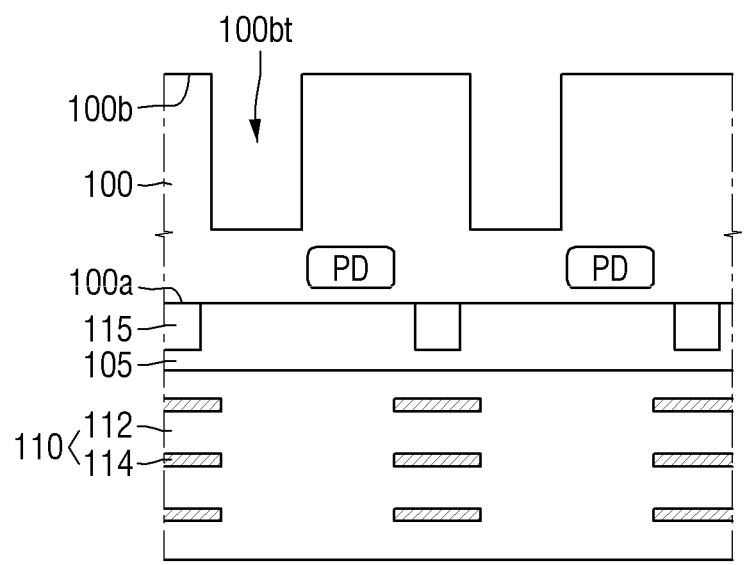
FIG. 24 and FIG. 25 are views illustrating intermediate stages of fabrication, provided to explain a method of fabricating an image sensor according to some example embodiments.
Figure 25:
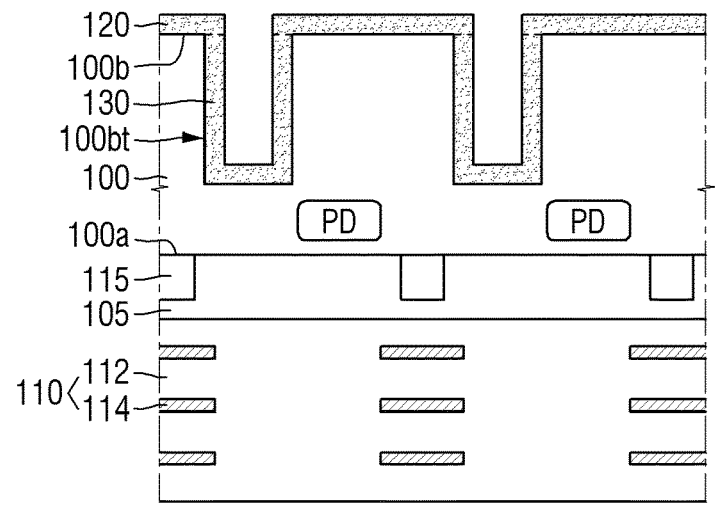

FIGS. 24 and 25 are views illustrating intermediate stages of fabrication, provided to explain a method of fabricating an image sensor according to some example embodiments. For reference, FIG. 24 may involve a process performed after FIG. 21.

Referring to FIG. 24, the first trench 100bt adjacent to the second surface 100b of the substrate (e.g., extending into the substrate 100 from the second surface 100b) is formed within the substrate 100.

Referring to FIG. 25, the first charge passivation layer 120 is formed along the second surface 100b of the substrate 100, and the first trench charge passivation layer 130 is formed along a sidewall and the bottom surface of the first trench 100bt. The first charge passivation layer 120 and the first trench charge passivation layer 130 may be formed at the same time.

Figure 26:
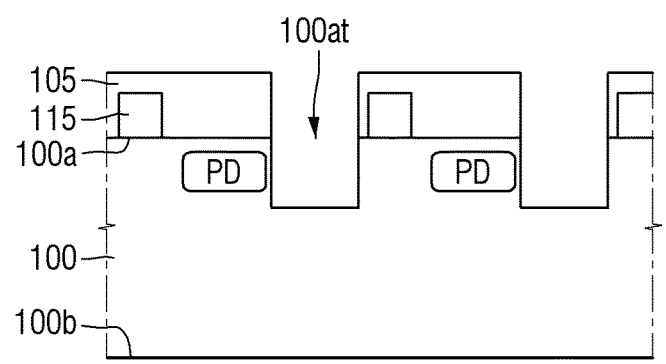
FIG. 26, FIG. 27, and FIG. 28 are views illustrating intermediate stages of fabrication, provided to explain a method of fabricating an image sensor according to some example embodiments.
Figure 27:
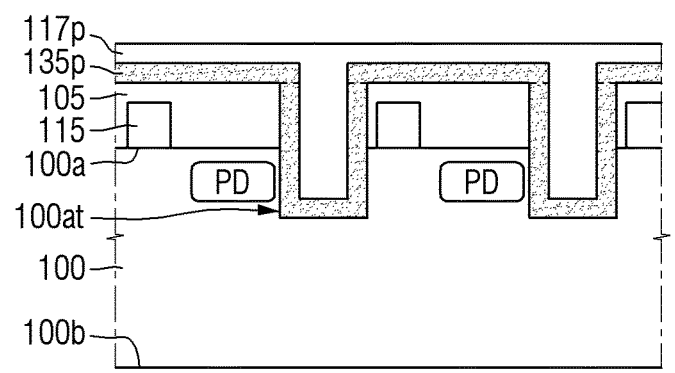
Figure 28:
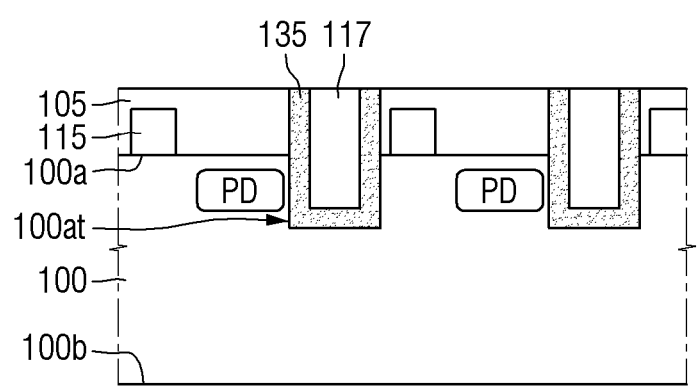

FIGS. 26 to 28 are views illustrating intermediate stages of fabrication, provided to explain a method of fabricating an image sensor according to some example embodiments. For reference, FIG. 26 may involve a process performed after FIG. 19.

Referring to FIG. 26, a second trench 100at adjacent to the first surface 100a of the substrate 100 (e.g., extending into the substrate 100 from the first surface 100a) is formed. The second trench 100at is formed within the pre-metal dielectric film layer 105 and the substrate 100.

Referring to FIG. 27, a pre-charge passivation layer 135p may be formed along an upper surface of the pre-metal dielectric film layer 105, and the sidewall and the bottom surface of the second trench 100at.

On the pre-charge passivation layer 135p, a pre-filling film 117p may be formed, filling the second trench 100at, and overlying the pre-charge passivation layer 135p formed on the upper surface of the pre-metal dielectric film layer 105.

Referring to FIG. 28, the pre-charge passivation layer 135p and the pre-filling film 117p formed on the upper surface of the pre-metal dielectric film layer 105 may be removed.

As a result, the second trench charge passivation layer 135 extends along the sidewall and the bottom surface of the second trench 100at, and the filling film 117 for filling the second trench 100at may be formed.

In concluding the detailed description, those skilled in the art will appreciate that many variations and modifications can be made some example embodiments without substantially departing from the principles of the present inventive concepts. Therefore, the disclosed example embodiments of the inventive concepts are used in a generic and descriptive sense only and not for purposes of limitation.

What is claimed is:

1. An image sensor, comprising:
    a substrate including a first surface and a second surface opposite to each other, the substrate further including a photoelectric conversion device;
    an insulating structure on the first surface of the substrate, the insulating structure including a metal wiring;
    a charge passivation layer on the second surface of the substrate, the charge passivation layer including an amorphous crystal structure, the charge passivation layer further including a plurality of different elements, each element of the different elements being a metal element or a metalloid element; and
    a microlens on the charge passivation layer.
2. The image sensor of claim 1, wherein,
    the charge passivation layer includes,
        a metal element or metalloid element selected from a first group of periodic table elements, and a metal element or metalloid element selected from a second group of periodic table elements, the second group different from the first group.

3. The image sensor of claim 1, wherein,
the charge passivation layer includes a lower passivation layer and an upper passivation layer, and
the lower passivation layer includes a first material element and the upper passivation layer includes a second material element different from the first material element.

4. The image sensor of claim 3, wherein each of the lower passivation layer and the upper passivation layer includes a plurality of different elements, each element of the different elements being a metal element or a metalloid element.

5. The image sensor of claim 4, wherein
the lower passivation layer includes,
an element selected from a first group of periodic table elements, and
an element selected from a second group of periodic table elements, the second group different from the first group, and
the upper passivation layer includes,
an element selected from a third group of periodic table elements, and
an element selected from a fourth group of periodic table elements, the fourth group different from the third group.

6. The image sensor of claim 3, wherein each passivation layer of the lower passivation layer and the upper passivation layer includes an amorphous crystal structure.

7. The image sensor of claim 3, further comprising:
an insert passivation layer between the lower passivation layer and the upper passivation layer,
wherein the insert passivation layer includes at least a portion of the first material element and at least a portion of the second material element.

8. The image sensor of claim 1, wherein,
the charge passivation layer includes a lower passivation layer and an upper passivation layer,
the lower passivation layer and the upper passivation layer include a common material, and
a stoichiometry of the lower passivation layer is different from a stoichiometry of the upper passivation layer.

9. The image sensor of claim 1, further comprising:
a trench extending at least partially through the substrate; and
a trench charge passivation layer extending along a sidewall of the trench.

10. The image sensor of claim 9, wherein,
the trench is adjacent to the second surface of the substrate, and
the charge passivation layer and the trench charge passivation layer are in contact with each other.

11. The image sensor of claim 1, wherein the charge passivation layer includes a high-k insulating material including at least one metal element.

12. The image sensor of claim 1, wherein,
the charge passivation layer is associated with a refractive index (n) greater than or equal to 1.6 and less than or equal to 4, and
the charge passivation layer is associated with an extinction coefficient (k) less than or equal to 0.01.

13. An image sensor, comprising:
a substrate including a first surface and a second surface opposite to each other, the substrate further including a photoelectric conversion device;
an insulating structure on the first surface of the substrate, the insulating structure including a metal wiring;
a charge passivation layer on the second surface of the substrate, the charge passivation layer including a first layer portion on the second surface of the substrate and a second layer portion on the first layer portion, at least a portion of the charge passivation layer including an amorphous crystal structure, the first layer portion and the second layer portion including a common material, and a stoichiometry of the first layer portion being different from a stoichiometry of the second layer portion; and
a microlens on the charge passivation layer.

14. The image sensor of claim 13, wherein,
the charge passivation layer includes a high-k insulating material, and
the high-k insulating material includes a first element selected from a first group of periodic table elements and a second element selected from a second group of periodic table elements, the second group different from the first group, each element of the first element and the second element including a metal element or a metalloid element.

15. The image sensor of claim 13, further comprising:
a trench extending partially through the substrate from the second surface of the substrate, such that the trench is isolated from the first surface of the substrate;
wherein the first layer portion of the charge passivation layer extends along a sidewall and a bottom surface of the trench.

16. The image sensor of claim 13, further comprising:
a trench extending at least partially through the substrate from the first surface of the substrate and towards the second surface of the substrate; and
a trench charge passivation layer extending along a sidewall of the trench;
wherein the trench charge passivation layer includes a high-k insulating material.

17. An image sensor, comprising:
a substrate; and
a charge passivation layer on the substrate, the charge passivation layer including an amorphous crystal structure, the charge passivation layer including an oxide material that includes a plurality of different elements, each element of the different elements being a metal element or a metalloid element.

18. The image sensor of claim 17, wherein,
the charge passivation layer includes,
a first element that includes a metal element or metalloid element selected from a first group of periodic table elements, and
a second element that includes a metal element or metalloid element selected from a second group of periodic table elements, the second group different from the first group.

19. The image sensor of claim 18, wherein,
the charge passivation layer includes a first oxide material and a second oxide material,
the first oxide material includes an oxide of the first element, and
the second oxide material includes an oxide of the second element.

* * * * *